[12] United States Patent
Asai et al.

(10) Patent No.: US 10,840,905 B2
(45) Date of Patent: Nov. 17, 2020

(54) TACTILE PRESENTATION DEVICE

(71) Applicant: TIANMA JAPAN, LTD., Kanagawa (JP)

(72) Inventors: Takuya Asai, Kanagawa (JP); Hiroshi Haga, Kanagawa (JP)

(73) Assignees: TIANMA JAPAN, LTD., Kanagawa (JP); Wuhan Tianma Micro-Electronics Co., Ltd., Wuhan (CN)

(*) Notice: Subject to any disclaimer, the term of this patent is extended or adjusted under 35 U.S.C. 154(b) by 0 days.

(21) Appl. No.: 16/559,792

(22) Filed: Sep. 4, 2019

(65) Prior Publication Data
US 2020/0076433 A1 Mar. 5, 2020

(30) Foreign Application Priority Data

Sep. 4, 2018 (JP) .................................. 2018-165436
Jul. 5, 2019 (JP) .................................. 2019-125790

(51) Int. Cl.
H03K 17/96 (2006.01)
G06F 3/044 (2006.01)
G06F 3/041 (2006.01)
G06F 3/01 (2006.01)

(52) U.S. Cl.
CPC ......... H03K 17/9622 (2013.01); G06F 3/016 (2013.01); G06F 3/0443 (2019.05); G06F 3/04164 (2019.05)

(58) Field of Classification Search
CPC ...... H03K 17/9622; H03K 2217/96062; G06F 3/016; G06F 3/04164; G06F 3/0443
See application file for complete search history.

(56) References Cited

U.S. PATENT DOCUMENTS

| | | | |
|---|---|---|---|
| 2005/0206625 A1* | 9/2005 | Mattice | G06F 3/0416 345/173 |
| 2013/0063381 A1 | 3/2013 | Wakuda | |
| 2014/0240110 A1* | 8/2014 | Suzuki | G06F 3/016 340/407.1 |
| 2014/0247227 A1* | 9/2014 | Jiang | H01L 41/0926 345/173 |
| 2015/0103024 A1* | 4/2015 | Haga | G06F 3/044 345/173 |
| 2016/0328019 A1* | 11/2016 | Taninaka | G06F 3/0485 |
| 2016/0342213 A1* | 11/2016 | Endo | H04B 7/26 |
| 2016/0349846 A1* | 12/2016 | Sugiura | G06F 3/016 |
| 2016/0349847 A1* | 12/2016 | Sugiura | G06F 3/04883 |
| 2017/0228065 A1* | 8/2017 | Lee | G06F 3/044 |

(Continued)

Primary Examiner — Tom V Sheng
(74) Attorney, Agent, or Firm — Sughrue Mion, PLLC

(57) ABSTRACT

A tactile presentation device includes a panel having a tactile presentation region including a plurality of electrodes, and a controller configured to control the panel. The controller is configured to supply a first sinusoidal signal and a second sinusoidal signal simultaneously to a first region in the tactile presentation region. The first sinusoidal signal and the second sinusoidal signal are supplied to different electrodes in the first region. The first sinusoidal signal and the second sinusoidal signal have the same frequency and different phases. The controller is configured to supply a reference signal having an amplitude smaller than the first sinusoidal signal and the second sinusoidal signal to a peripheral region surrounding the first region.

18 Claims, 17 Drawing Sheets

(56) References Cited

U.S. PATENT DOCUMENTS

| | | | |
|---|---|---|---|
| 2017/0228086 A1* | 8/2017 | Lee | G06F 3/0416 |
| 2018/0024637 A1* | 1/2018 | Endo | G06F 3/016 |
| | | | 715/702 |
| 2018/0052567 A1* | 2/2018 | Miyamoto | G06F 3/01 |
| 2018/0089967 A1* | 3/2018 | Sugimoto | G08B 6/00 |
| 2018/0314401 A1* | 11/2018 | Endo | G06F 3/0484 |
| 2018/0329499 A1* | 11/2018 | Taninaka | G06F 3/016 |

\* cited by examiner

TACTILE PRESENTATION DEVICE

CROSS-REFERENCE TO RELATED APPLICATIONS

This Non-provisional application claims priority under 35 U.S.C. § 119(a) on Patent Application No. 2018-165436 filed in Japan on Sep. 4, 2018 and Patent Application No. 2019-125790 filed in Japan on Jul. 5, 2019, the entire contents of which are hereby incorporated by reference.

BACKGROUND

This disclosure relates to a technology to present tactile stimuli to a human body with electrostatic force.

The background art of this disclosure is tactile presentation technology to present tactile stimuli to a human body with electrostatic force. For example, US 2013/0063381 A discloses a technique that applies differential voltages to electrodes to present tactile stimuli. Specifically, the technique according to US 2013/0063381 A applies differential voltages to positive electrodes and negative electrodes to capacitively couple the positive and negative electrodes to a fingertip to present tactile stimuli.

SUMMARY

A tactile presentation device according to an aspect of this disclosure includes a panel having a tactile presentation region including a plurality of electrodes, and a controller configured to control the panel. The controller is configured to supply a first trigonometric series signal and a second trigonometric series signal simultaneously to a first region in the tactile presentation region. The first trigonometric series signal and the second trigonometric series signal each have multiple frequency component terms, wherein the multiple frequency component terms of the first trigonometric series signal are the same as the multiple frequency component terms of the second trigonometric series signal. The first trigonometric series signal and the second trigonometric series signal are supplied to different electrodes in the first region. The first trigonometric series signal and the second trigonometric series signal have different phases. The controller is configured to supply a reference signal to a region adjacent to the first region, the reference signal having frequency components terms with coefficients smaller than coefficients of the frequency component terms of the first trigonometric series signal and the second trigonometric series signal.

It is to be understood that both the foregoing general description and the following detailed description are exemplary and explanatory and are not restrictive of this disclosure.

EMBODIMENTS

Hereinafter, embodiments of this disclosure will be described with reference to the accompanying drawings. It should be noted that the embodiments are merely examples to implement the features of this disclosure and are not to limit the technical scope of this disclosure. Elements common to the drawings are denoted by the same reference signs.

The tactile presentation device disclosed herein supplies adjacent electrodes of the tactile presentation panel with sinusoidal signals having the same frequency but different phases. As a result, the tactile presentation device provides tactile stimuli to the user swiping the surface of the tactile presentation device with a touching object such as a finger or a touch pen. Furthermore, the tactile presentation device changes the phase difference of the sinusoidal signals. As a result, the strength of the tactile stimuli provided to the user changes.

Configuration of Tactile Presentation Device

Figure 1:
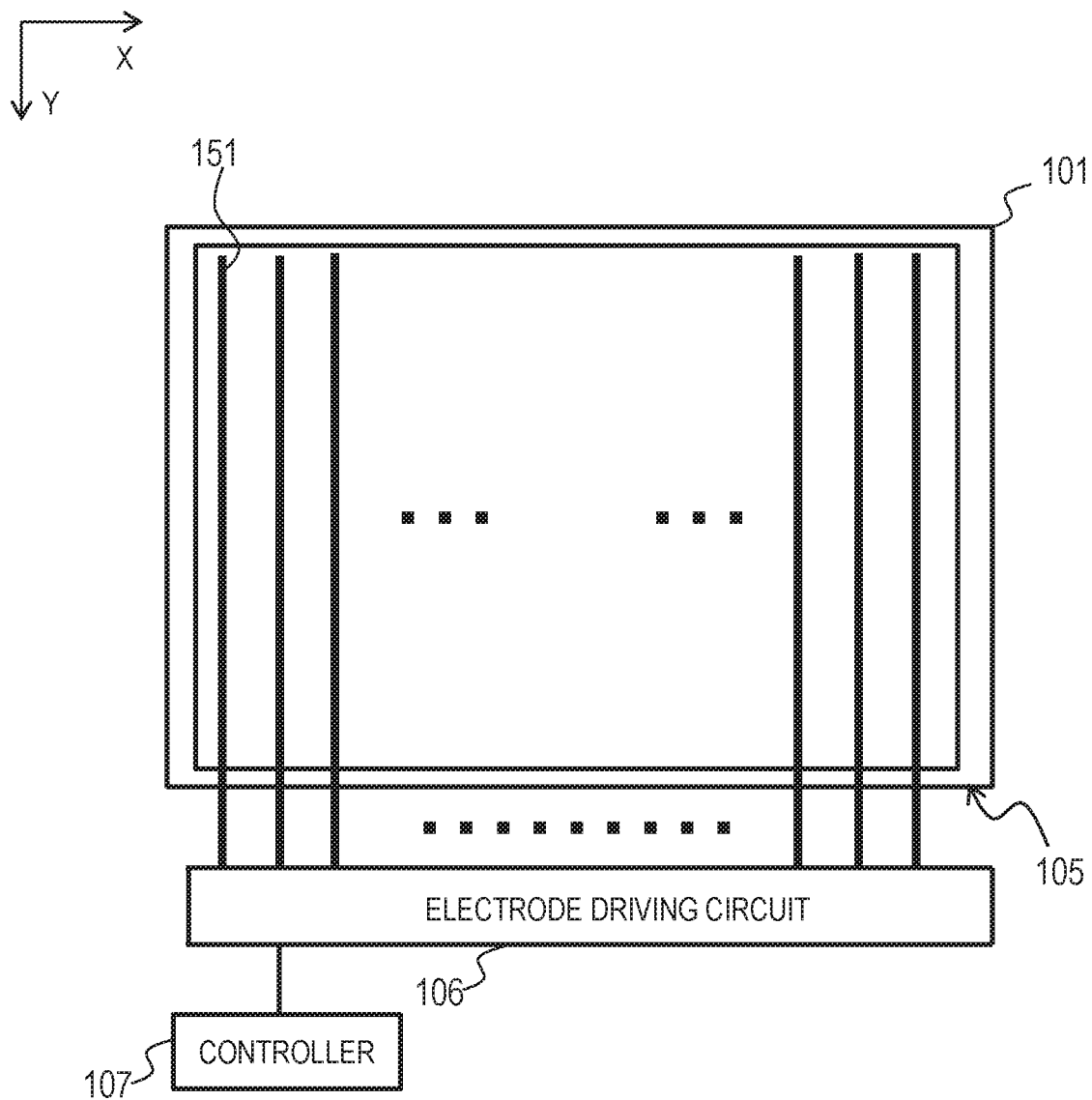
FIG. 1 schematically illustrates a configuration example of a tactile presentation device.

FIG. 1 schematically illustrates a configuration example of a tactile presentation device. The tactile presentation device 100 includes a tactile presentation panel 105, an electrode driving circuit 106, and a controller 107. The tactile presentation panel 105 includes a support substrate 101 and a plurality of lines 151 and a plurality of electrodes (not shown) arrayed on the support substrate 101. In FIG. 1, only one of the lines is provided with a reference sign 151 by way of example. The surface of the tactile presentation panel 105 is covered with an insulating film.

The tactile presentation panel 105 can be superposed on a visual display unit to be used together. For example, the support substrate 101 is made of glass or resin and the electrodes are made of indium tin oxide (ITO). The tactile presentation device 100 presents tactile stimuli associated with the image displayed on the visual display unit. The tactile presentation device 100 can be a stand-alone device that is not mounted on a visual display unit. For example, the tactile presentation device 100 can be a tablet device that presents tactile stimuli without displaying an image.

The lines 151 are connected with the electrode driving circuit 106. The lines 151 transmit signals for the electrodes that present tactile stimuli (texture). In the example of FIG. 1, the lines 151 are disposed to extend along the Y-axis and be distant along the X-axis from one another. The layout of the lines 151 depends on the design. For example, the tactile presentation device 100 can include lines disposed to extend along the X-axis and be distant along the Y-axis from one another, in place of or in addition to the lines 151.

The electrode driving circuit 106 supplies specific voltage signals to the lines 151. The electrode driving circuit 106 is connected with the controller 107 through a control signal line. The controller 107 controls the electrode driving circuit 106 based on information on the region selected to present tactile stimuli.

The controller 107 includes a processor, a memory, a storage, and an interface with the external, for example. These elements are interconnected through internal lines. The processor works in accordance with a program stored in the memory to implement a predetermined function. The program to be executed and the data to be referenced by the processor are loaded from the storage to the memory, for example. The controller 107 can include a logical circuit for implementing a predetermined function in addition to or in place of the processor. This configuration enables the tactile presentation device 100 to present tactile stimuli in the selected region.

Figure 2A:
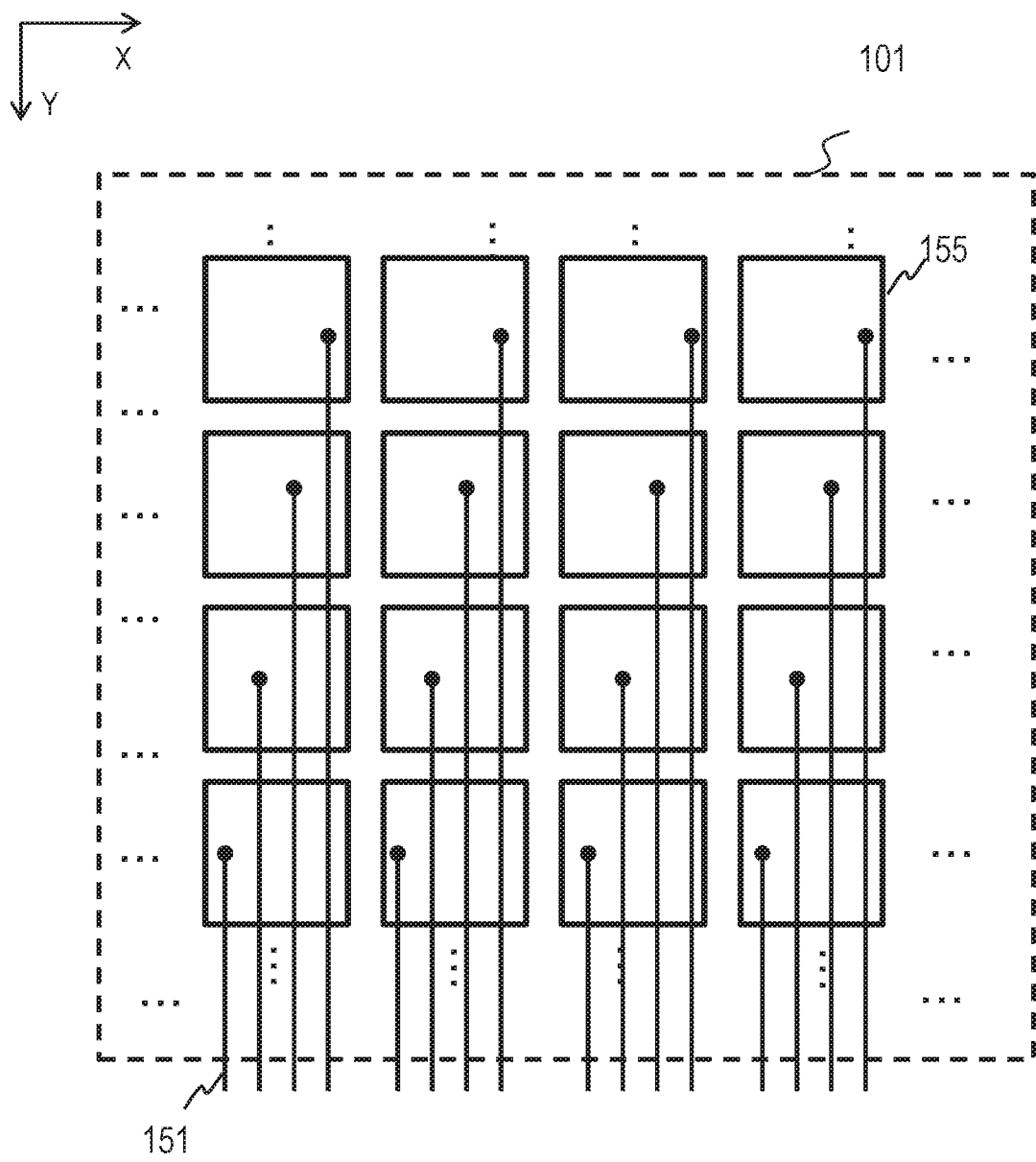
FIG. 2A illustrates an example of the electrode layout of a tactile presentation panel.

Hereinafter, examples of the layout of the electrodes and the lines in the tactile presentation panel 105 are described. The provided are merely examples; the disposition of the lines and the disposition of the electrodes can be combined optimally depending on the design. FIG. 2A illustrates an example of the layout of the electrodes and the lines in the tactile presentation panel 105. In FIG. 2A, one of the electrodes and one of the lines are provided with reference signs 155 and 151, respectively, by way of example. Each electrode 155 is square. Each electrode 155 is distant from the other electrodes 155 and connected with a different line 151 from the electrode driving circuit 106.

The electrodes 155 and the lines 151 are formed on different layers; a line 151 and an electrode 155 are connected through a contact hole. The controller 107 can control individual electrodes 155 separately. In other words, the controller 107 can supply all electrodes 155 with different signals (potentials). The electrodes 155 are transparent electrodes made of ITO, for example.

Figure 2B:
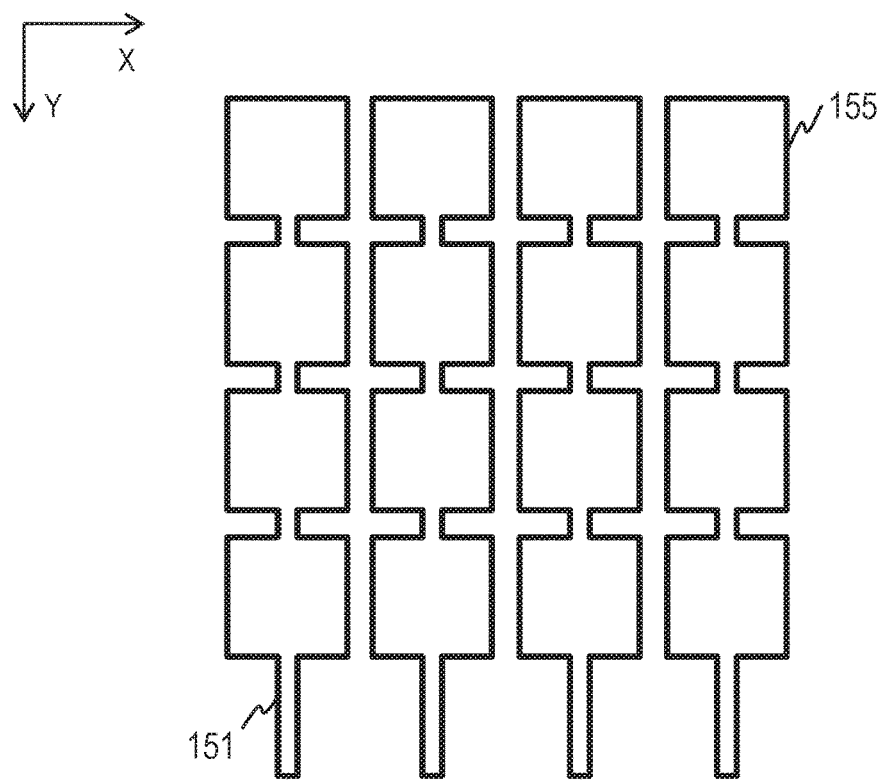
FIG. 2B illustrates another example of the electrode layout of a tactile presentation panel.

The electrodes 155 can have desired shapes, which do not need to be square. Some of the electrodes 155 can have a shape different from the shape of the other electrodes 155. In the layout example in FIG. 2A, the electrodes 155 are disposed along the X-axis and the Y-axis like a matrix. The electrodes 155 can be laid out as desirable other than a matrix layout. FIG. 2B illustrates another example of the layout of the electrodes and the lines in the tactile presentation panel 105. FIG. 2B shows some of the electrodes and the lines. In the example of FIG. 2B, one of the electrodes and one of the lines are provided with reference signs 155 and 151, respectively, by way of example. The electrodes 155 are square and they are disposed in a matrix. The lines 151 and the electrodes 155 are formed on the same layer and made of ITO, for example. Electrodes 155 disposed in a line along the Y-axis are connected with one line 151. Each electrode 155 is distant from the other electrodes 155 in the direction along the X-axis.

Each line 151 connects the electrode 155 at an end of the electrodes 155 disposed in a line along the Y-axis and a pin of the electrode driving circuit 106 and further, connects electrodes 155 adjacent along the Y-axis. The line 151 is partially shared by electrodes 155. The electrodes along the Y-axis are supplied with the same signal. This configuration attains a smaller number of channels to drive the electrodes 155.

Figure 2C:
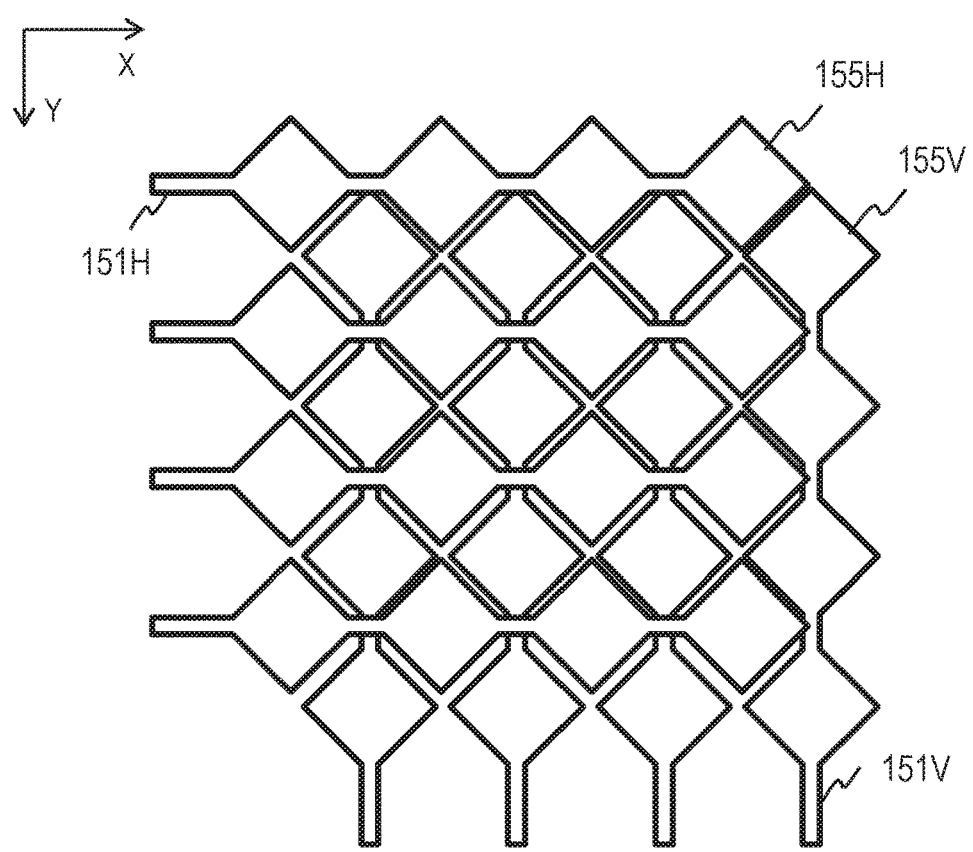
FIG. 2C illustrates still another example of the electrode layout of a tactile presentation panel.

FIG. 2C illustrates still another example of the layout of the electrodes and the lines in the tactile presentation panel 105. This configuration attains a smaller number of channels to drive the electrodes 155. FIG. 2C shows some of the electrodes and the lines. The tactile presentation panel 105 includes a plurality of lines 151H extending along the X-axis and a plurality of lines 151V extending along the Y-axis. One of the lines extending along the X-axis is provided with a reference sign 151H and one of the lines extending along the Y-axis is provided with a reference sign 151V, by way of example.

The tactile presentation panel 105 includes pluralities of electrodes 155H each disposed in a line along the X-axis and connected with a line 151H. The tactile presentation panel 105 includes pluralities of electrodes 155V each disposed in a line along the Y-axis and connected with a line 151V. The electrodes connected with different lines are distant from one another. One of the electrodes connected with a line 151H is provided with a reference sign 155H and one of the electrodes connected with a line 151V is provided with a reference sign 155V, by way of example. The lines 151H and the electrodes 155H are formed on the same layer and made of ITO, for example. The lines 151V and the electrodes 155V are formed on the same layer and made of ITO, for example. Each line 151H intersects with the lines 151V with an insulating film interposed therebetween to maintain their electrical isolation.

The electrodes 155H and 155V have diamond shapes when viewed along the X-axis or the Y-axis. The electrodes 155H and 155V are laid out in a checkerboard pattern (delta arrangement). Each electrode 155V is disposed between electrodes 155H adjacent to each other and each electrode 155H is disposed between electrodes 155V adjacent to each other. Each electrode 155V is disposed between lines 151H adjacent to each other and each electrode 155H is disposed between lines 151V adjacent to each other.

Each line 151H connects the electrode 155H at an end of the electrodes 155H disposed in a line along the X-axis and a pin of the electrode driving circuit 106 and further, connects electrodes 155H adjacent along the X-axis. The line 151H is partially shared by electrodes 155H. The electrodes 155H connected with a line 151H are supplied with the same signal.

Each line 151V connects the electrode 155V at an end of the electrodes 155V disposed in a line along the Y-axis and a pin of the electrode driving circuit 106 and further, connects electrodes 155V adjacent along the Y-axis. The line 151V is partially shared by electrodes 155V. The electrodes 155V connected with a line 151V are supplied with the same signal.

Signal Supply to Electrodes

Figure 3:
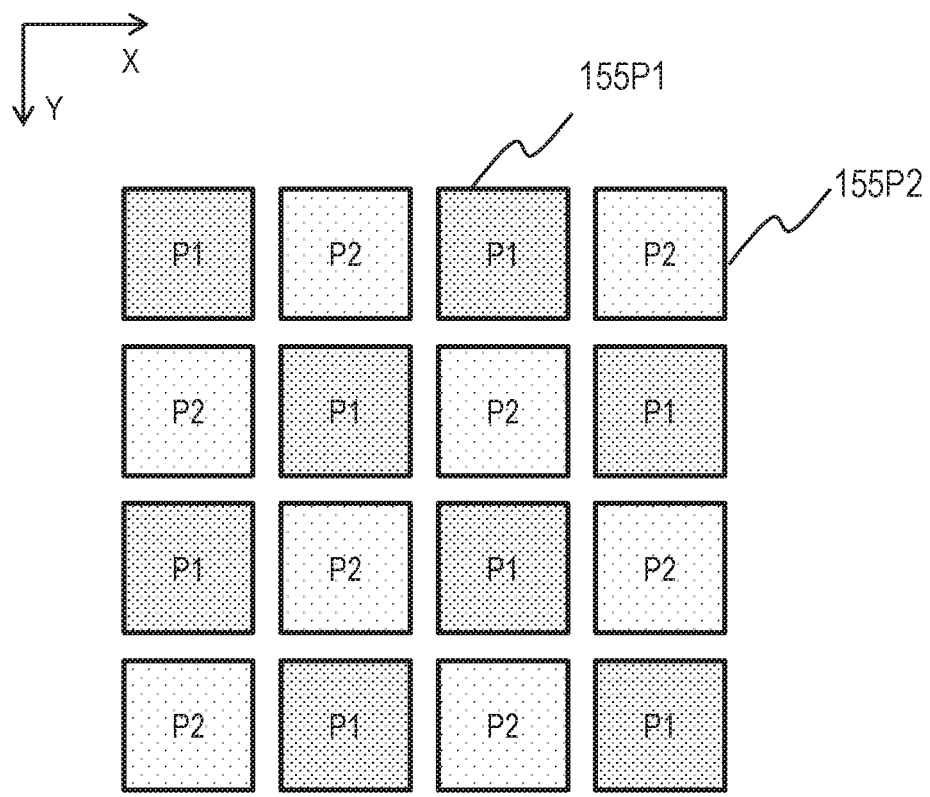
FIG. 3 illustrates some of the electrodes of a tactile presentation panel and an example of the signals supplied to the electrodes.

FIG. 3 illustrates some of the electrodes 155 of the tactile presentation panel 105 and an example of the signals supplied to the electrodes 155. In the following description, the tactile presentation panel 105 has the layout of electrodes and lines in FIG. 2A, unless stated otherwise. In FIG. 3, each electrode 155P1 is supplied with a signal P1 and each electrode 155P2 is supplied with a signal P2. The signals P1 and P2 are supplied simultaneously. In FIG. 3, only one of the electrodes supplied with the signal P1 is provided with a reference sign 155P1 and only one of the electrodes supplied with the signal P2 is provided with a reference sign 155P2.

The signals P1 and P2 are sinusoidal waves having the same frequency and the same amplitude but having different phases. For example, the signal P1 is expressed as $A \sin(\omega t)$ and the signal P2 is expressed as $A \sin(\omega t + \varphi)$. The amplitudes can be different but preferably, they are to be the same for simplicity of generating the signals. In the example of FIG. 3, the electrodes 155P1 supplied with the signal P1 and the electrodes 155P2 supplied with the signal P2 are disposed in a checkerboard pattern. That is to say, the electrodes horizontally and vertically adjacent to an electrode 155P1 are electrodes 155P2 and the electrodes horizontally and vertically adjacent to an electrode 155P2 are electrodes 155P1. In this description, the vertical directions are the directions along the Y-axis and the horizontal directions are the directions along the X-axis.

Figure 4:
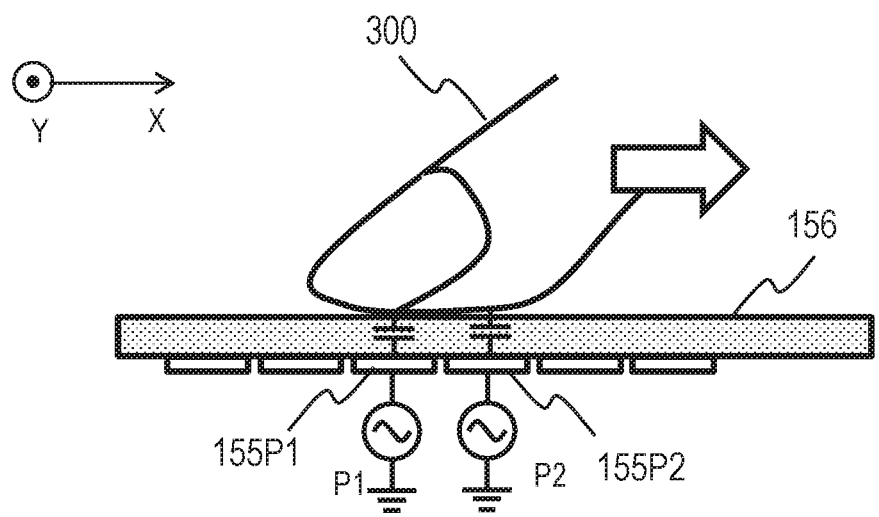
FIG. 4 schematically illustrates a cross-section of a part of a tactile presentation panel and its relationship with a finger touching the tactile presentation panel.

FIG. 4 schematically illustrates a cross-section of a part of the tactile presentation panel 105 and its relationship with a finger 300 touching the tactile presentation panel 105. The finger 300 is an example of a touching object that sweeps the surface of the tactile presentation panel 105. The front faces of the electrodes 155P1 and the electrodes 155P2 are covered with an insulating film 156. The insulating film 156 is provided between the finger 300 and the electrodes 155P1 and 155P2. Here, the face of the tactile presentation panel 105 to be swept by a touching object is referred to as front face and the opposite face is referred to as back face.

The contact face between the finger 300 and the insulating film 156 is opposed to an electrode 155P1 and an electrode 155P2. The finger 300 is capacitively coupled with the electrodes 155P1 and 155P2 via the insulating film 156. A vibrating electrostatic force between the finger 300 and the electrode 155P1 and a vibrating electrostatic force between the finger 300 and the electrode 155P2 cause tactile stimuli to be felt on the finger sliding on the tactile presentation panel 105. The strength of the tactile stimuli can be changed by changing the phase difference $\varphi$ between the signal P1 and the signal P2.

Figure 5:
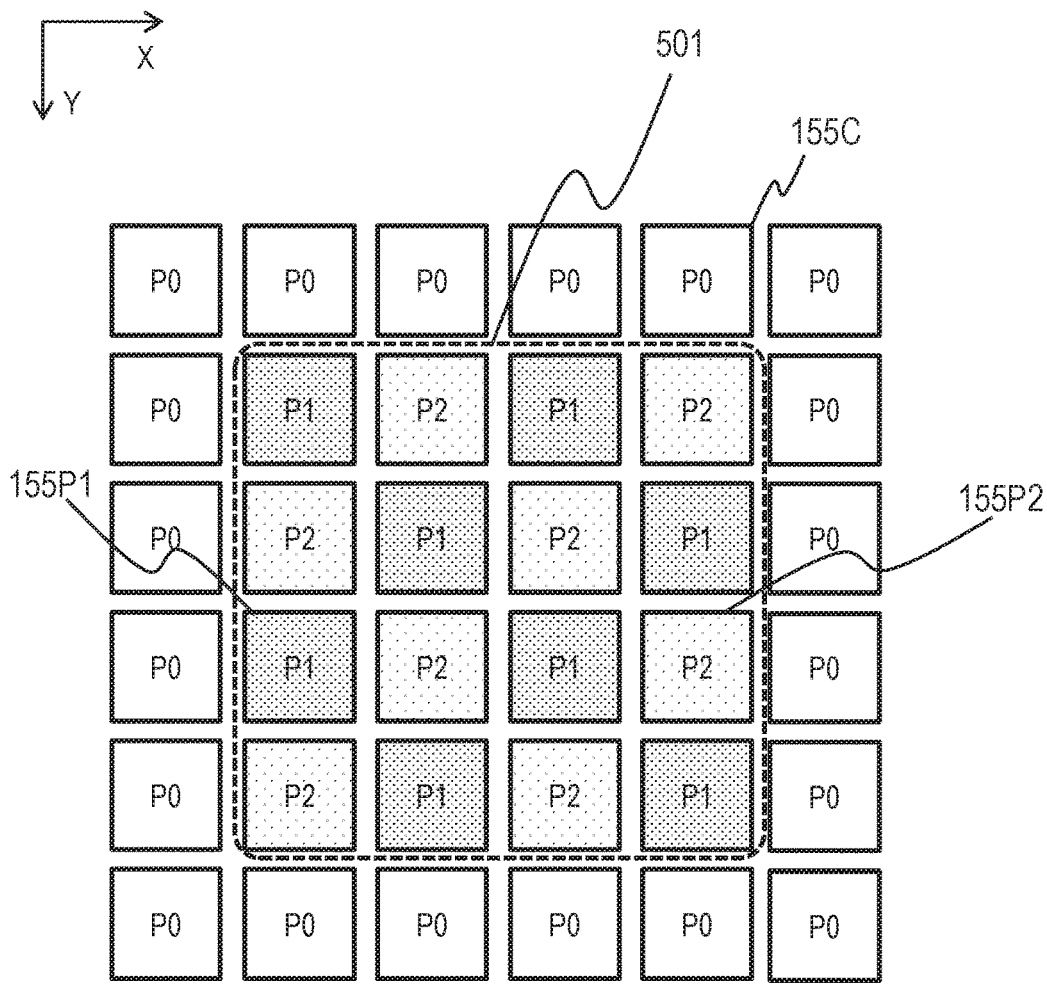
FIG. 5 illustrates a way to supply signals to the electrodes so that only a selected region (selected electrodes) of the tactile presentation panel will present tactile stimuli.

FIG. 5 illustrates a way to supply signals to the electrodes so that only a selected region (selected electrodes) of the tactile presentation panel 105 will present tactile stimuli. In FIG. 5, a selected region (selected electrodes) 501 out of the entire region available for the tactile presentation panel 105 to present tactile stimuli provides tactile stimuli and its peripheral region (peripheral electrodes) does not provide tactile stimuli.

The controller 107 supplies a signal P1 and a signal P2 to the electrodes 155P1 and 155P2, respectively, within the region 501. Like the example described with reference to FIG. 3, the electrodes 155P1 and 155P2 are disposed in a checkerboard pattern. The controller 107 supplies a reference signal to the electrodes 155C in the periphery of the region 501. The reference signal P0 can be an alternating signal having a smaller amplitude than both of the signals P1 and P2 or a constant potential. The amplitude of the constant potential is 0. The reference signal can be the ground potential. In FIG. 5, only one of the electrodes in the periphery of the region 501 is provided with a reference sign 155C by way of example.

The reference signal can be a reference alternating signal in a sensor circuit, which will be described later. It is preferable that the amplitude of the reference alternating signal be smaller than the amplitude of the tactile signal, specifically, an amplitude equal to or lower than 20 V.

Figure 6:
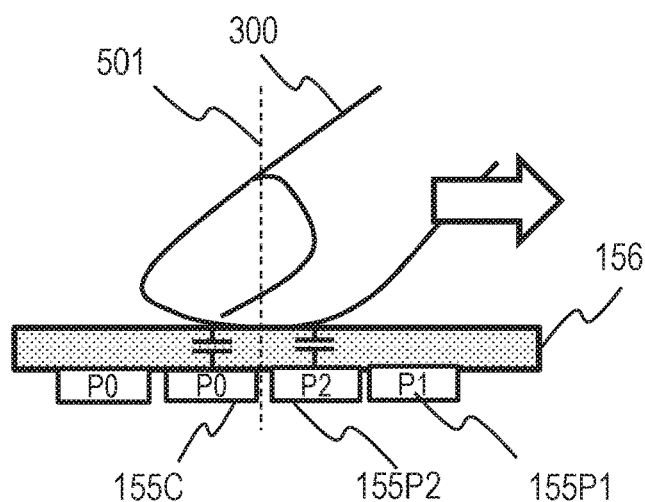
FIG. 6 schematically illustrates a cross-section of a part of a tactile presentation panel and its relationship with a finger touching the tactile presentation panel in the example of the pattern of the signals supplied to the electrodes in FIG. 5.

FIG. 6 schematically illustrates a cross-section of a part of the tactile presentation panel 105 and its relationship with a finger touching the tactile presentation panel 105 in the example of the pattern of the signals P0, P1, and P2 supplied to the electrodes in FIG. 5. The user swipes the tactile presentation panel 105 from the outside of the region 501 into the region 501 with a finger 300. That is to say, the finger 300 moves from the region opposed to electrodes 155C supplied with the signal P0 into the region opposed to electrodes 155P1 and 155P2 supplied with the signals P1 and P2.

In the example of FIG. 6, the finger 300 is opposed to an electrode 155C and an electrode 155P2 across the boundary of the region 501 and capacitively coupled with these electrodes. Depending on the position, the finger 300 is opposed to an electrode 155C and an electrode 155P1 across the boundary of the region 501 and capacitively coupled with these electrodes. The capacitive coupling of the finger 300 with the electrode 155C supplied with a reference signal makes the boundary of the region 501 to be felt clearly. In the meanwhile, if another erroneous touch with a different finger occurs outside the region 501, no tactile stimuli are provided there because all electrodes 155C are supplied with a reference signal.

Figure 7:
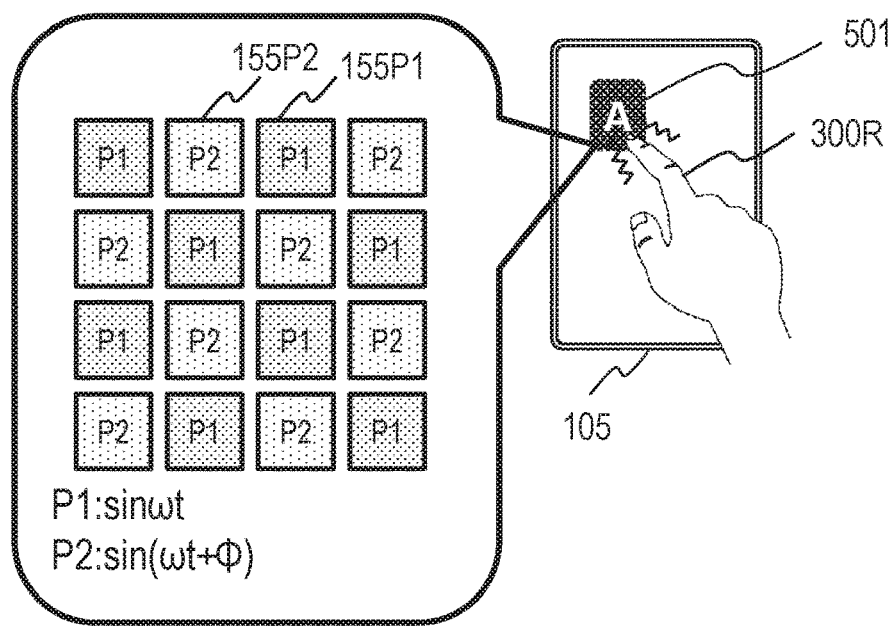
FIG. 7 illustrates an example of the signals supplied by the controller to the electrodes in the region available for the tactile presentation panel to present tactile stimuli.
Figure 8:
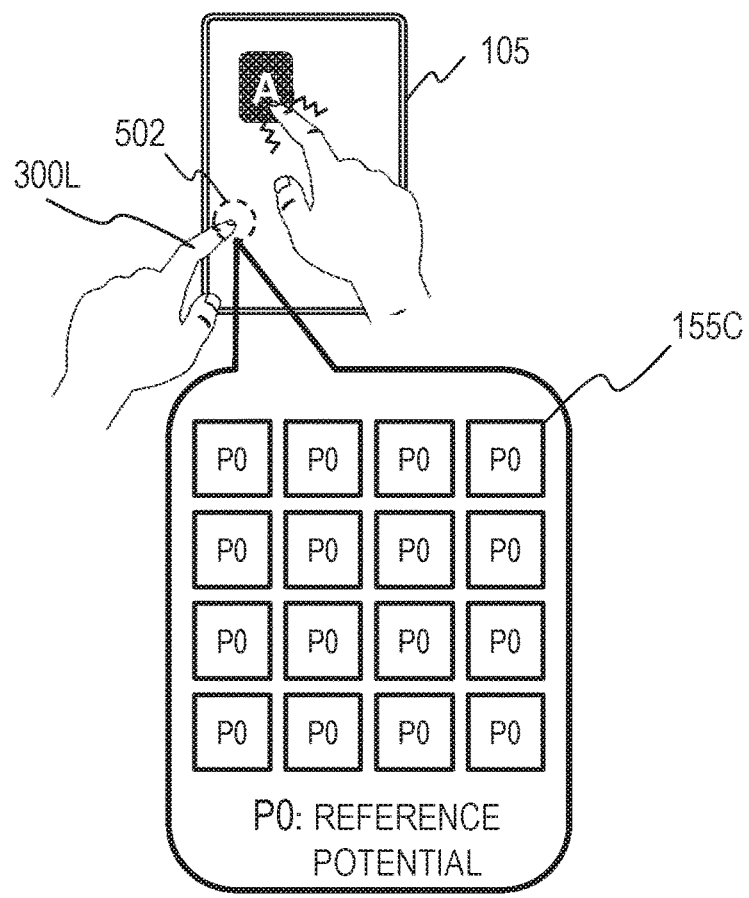
FIG. 8 illustrates an example of the signals supplied by the controller to the electrodes in the region available for the tactile presentation panel to present tactile stimuli.

FIGS. 7 and 8 illustrate an example of the signals supplied by the controller 107 to the electrodes 155 in the region (tactile presentation region) available for the tactile presentation panel 105 to present tactile stimuli. In the example of FIG. 7, one selected region 501 is supplied with sinusoidal signals P1 and P2 having different phases. A texture can be felt in the region 501 with a finger 300R. The pattern of the signals P1 and P2 in the region 501 is the same as the one in FIG. 3.

As illustrated in FIG. 8, the region except for the region 501 is supplied with a reference signal P0 having a constant potential. A finger 300L is in contact with a region 502 outside the region 501. Since the electrodes 155C in the region 502 are supplied with the reference signal P0 having a constant potential, no texture is felt with the finger 300L.

Figure 9A:
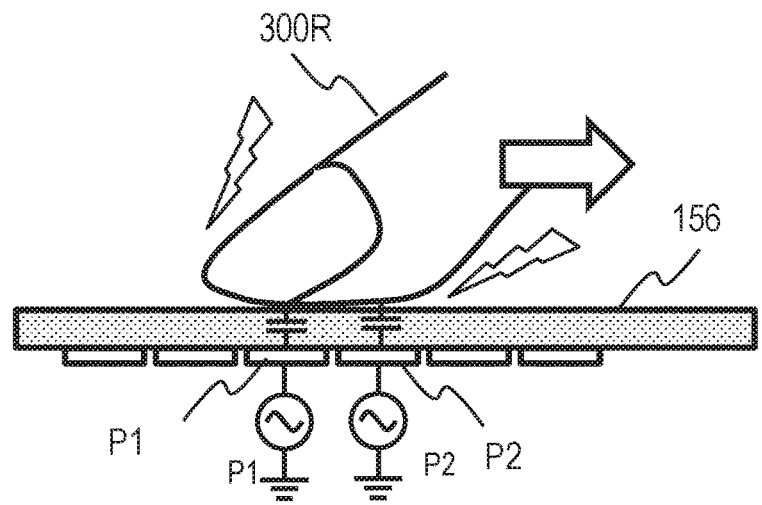
FIG. 9A schematically illustrates a cross-section of a part of a tactile presentation panel and its relationship with a finger touching the tactile presentation panel.
Figure 9B:
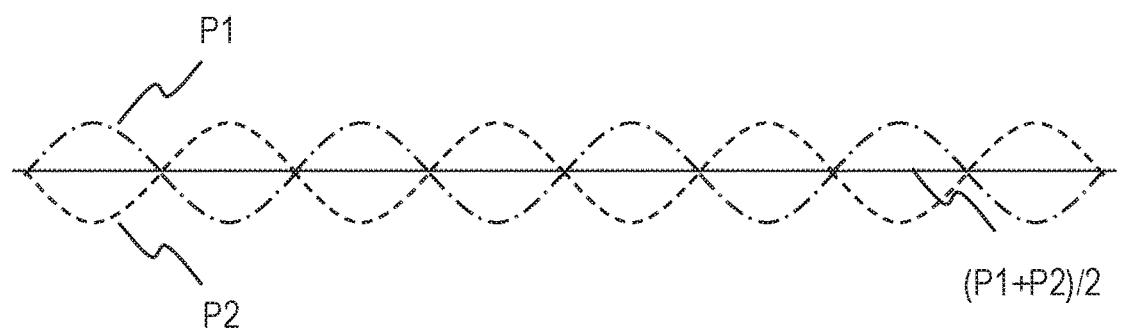
FIG. 9B illustrates variation of two signals.
Figure 9C:
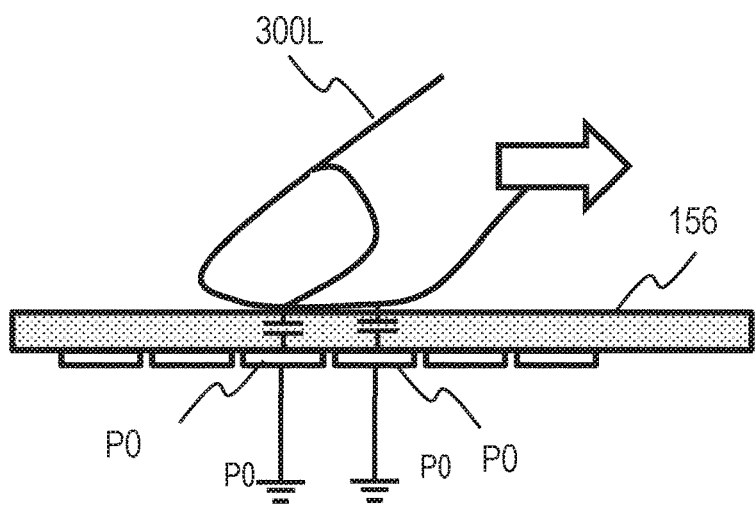
FIG. 9C schematically illustrates a cross-section of another part of the tactile presentation panel and its relationship with another finger touching the tactile presentation panel.

In the example of FIGS. 7 and 8, the phase difference ($\varphi$) between the sinusoidal signals P1 and P2 can be 180 degrees. FIG. 9A schematically illustrates a cross-section of a part of a tactile presentation panel and its relationship with a finger touching the tactile presentation panel. FIG. 9B illustrates variation of the signals P1 and P2. FIG. 9C schematically illustrates a cross-section of another part of the tactile presentation panel and its relationship with another finger touching the tactile presentation panel.

As illustrated in FIGS. 9A to 9C, the average of the potentials of the signals P1 and P2 is substantially constant; accordingly, the finger 300R touching the selected region 501 is little affected by potential variation in the region 501. Even if the finger 300R and the finger 300L are of the same person, the finger 300L is little affected by the potential variation in the finger 300R; accordingly, the user can clearly feel the difference in texture in between the selected region 501 and the region 502 outside the selected region.

Furthermore, electric current flows from the finger touching the region 501 into the human body. The amount of the current that flows into the human body varies depending on the phase difference ($\varphi$) between the sinusoidal signals P1 and P2. For example, when the phase difference ($\varphi$) is 0 degrees, electric current flows from an electrode into the human body having a certain amount of capacitance. The person feels numbness. However, when the phase difference ($\varphi$) is 180 degrees, electric current flows between the electrodes P1 and P2. The electric current hardly flows into the human body. Accordingly, when the phase difference is 180 degrees, the person does not feel the numbness and therefore, feels a texture strongly.

Figure 10:
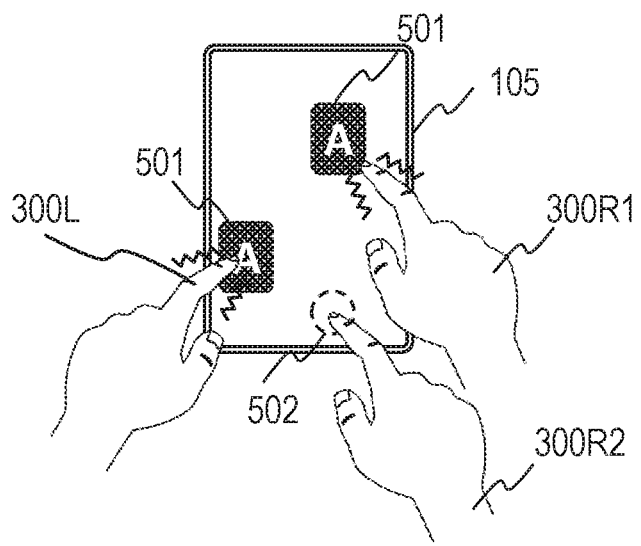
FIG. 10 illustrates an example of the relations between selected regions and fingers.

The tactile presentation panel 105 can have a plurality of selected regions 501 that are spatially separate. FIG. 10 illustrates an example of the relations between the regions 501 and fingers. Each of the plurality of regions 501 is supplied with sinusoidal signals P1 and P2. The user can feel a texture with the fingers 300R1 and 300L touching the regions 501 but does not feel a texture with the finger 300R2 touching a region 502 outside the selected regions. The pattern of the signals P1 and P2 in the regions 501 are the same as the one in FIG. 3.

Figure 11:
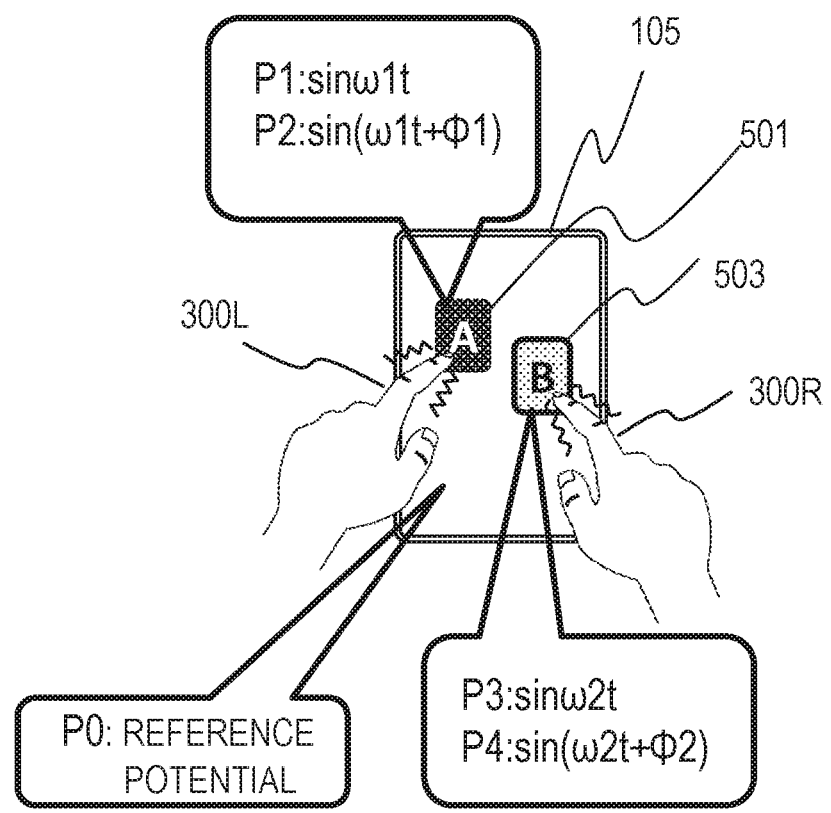
FIG. 11 illustrates another example of the signals supplied by the controller to the electrodes in the region available for the tactile presentation panel to present tactile stimuli.

FIG. 11 illustrates another example of the signals supplied by the controller 107 to the electrodes 155 in the region available for the tactile presentation panel 105 to present tactile stimuli. The controller 107 supplies the electrodes 155 in the region 501 and the electrodes 155 in the region 503 with signal pairs to present tactile stimuli for the fingers 300R and 300L, respectively. The regions 501 and 503 are separate and do not overlap at all. The controller 107 supplies the electrodes 155 outside the regions 501 and 503 with a reference signal P0.

Specifically, the controller 107 supplies the electrodes 155 in the region 501 with a signal pair of a sinusoidal signal P1 and a sinusoidal signal P2. The signal P1 and the signal P2 have the same frequency $\omega 1$ but have different phases (phase difference $\varphi 1$). The disposition of the electrodes to be supplied with the signal P1 and the signal P2 can be the same as the disposition described with reference to FIG. 3.

The controller 107 supplies the electrodes 155 in the region 503 with a signal pair of a sinusoidal signal P3 and a sinusoidal signal P4. The signal P3 and the signal P4 have the same frequency $\omega 2$ but have different phases (phase difference $\varphi 2$). The disposition of the electrodes to be supplied with the signal P3 and the signal P4 can be the same as the disposition described with reference to FIG. 3.

The frequency $\omega 2$ of the signals P3 and P4 is the same as or different from the frequency $\omega 1$ of the signals P1 and P2. Configuration such that the signals P1 to P4 have the same frequency facilitates the control of the tactile presentation panel 105. The phase difference $\varphi 2$ between the signals P3 and P4 is different from the phase difference $\varphi 1$ between the signals P1 and P2. The different phase differences enable the regions 501 and 503 to present different strengths of tactile stimuli.

The electrodes 155 in the region except for the regions 501 and 503 are supplied with a reference signal P0 having a constant potential. For this reason, the boundaries of the regions 501 and 503 can be felt clearly as described above. In the meanwhile, if another erroneous touch with a different finger occurs outside the regions 501 and 503, no tactile stimuli are provided there.

In the example of FIG. 11, the controller 107 supplies sinusoidal signal pairs different in phase difference to the regions 501 and 503 separate from each other (that do not share any electrode). As a result, different strengths of tactile stimuli can be provided to the user in the regions 501 and 503.

In another example, the controller 107 can supply sinusoidal signal pairs different in phase difference to the same region or two regions overlapping each other in separate periods (having no overlap period there). For example, the controller 107 supplies signals P1 and P2 to the electrodes in a region 501 in a first period and supplies signals P3 and P4 to the electrodes in the region 501 in a second period subsequent to the first period.

The controller 107 can change the region (electrodes) where to supply a sinusoidal signal pair to change the position and the shape of the region to actually present tactile stimuli. For example, the controller 107 can successively move the selected region like a motion picture.

Figure 12:
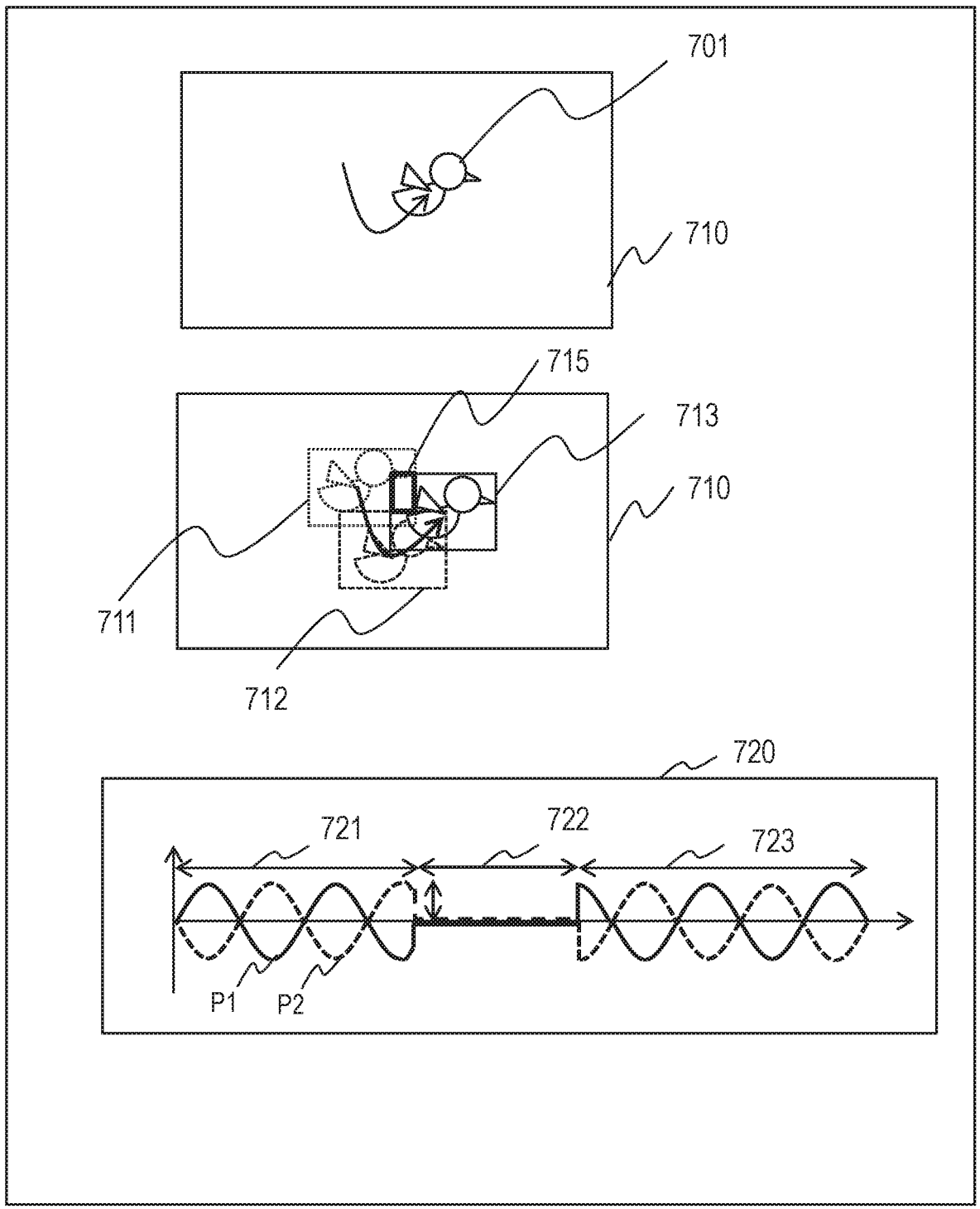
FIG. 12 illustrates an example of an image displayed on a display device and a region to present tactile stimuli.

FIG. 12 illustrates an example of an image displayed on a display device and a region to present tactile stimuli. An image 701 moves within the display region 710 of the display device with time. A region 711 to present tactile stimuli also moves together with the image 701. Specifically, the region to present tactile stimuli moves from the region 711 to the region 713 via the region 712. The image 701 also moves from the region 711 to the region 713 via the region 712.

The waveform diagram 720 represents the signals to be supplied to the electrodes in the region 715. In the period 721, the controller 107 supplies signals P1 and P2 to the electrodes in the region 715. The phase difference between the signals P1 and P2 can be 180°. In the period 722, the controller 107 supplies a reference signal to the electrodes in the region 715. In the period 723, the controller 107 supplies the signals P1 and P2 to the electrodes in the region 715.

At the end of the period 721, the electrodes in the region 715 have a predetermined potential. However, the electrodes in the region 715 are supplied with a reference signal in the period 722 and therefore, the signals supplied in the period 723 are not affected by the potential stored in the period 721. As described above, the reference signal can have a constant potential or a low-voltage oscillatory potential having approximately one-hundredth of the amplitude of the tactile signal. The frequency of the tactile signal is, for example, dozens to hundreds of hertz, which is the vibration detection threshold for the nerves.

The tactile signal can be not only a single sinusoidal signal but also a trigonometric series signal including multiple frequency components. The sameness of the frequencies of the tactile signals for adjacent electrodes means that one trigonometric series signal has the same frequency component terms as the multiple terms of the other trigonometric series signal without excess or deficiency. The sameness of the amplitude means that the coefficients of the corresponding frequency component terms are the same between the trigonometric series signals. The tactile signal in this disclosure can be a rectangular wave signal, a triangular wave signal, and another type of trigonometric series signal, for example.

Figure 13:
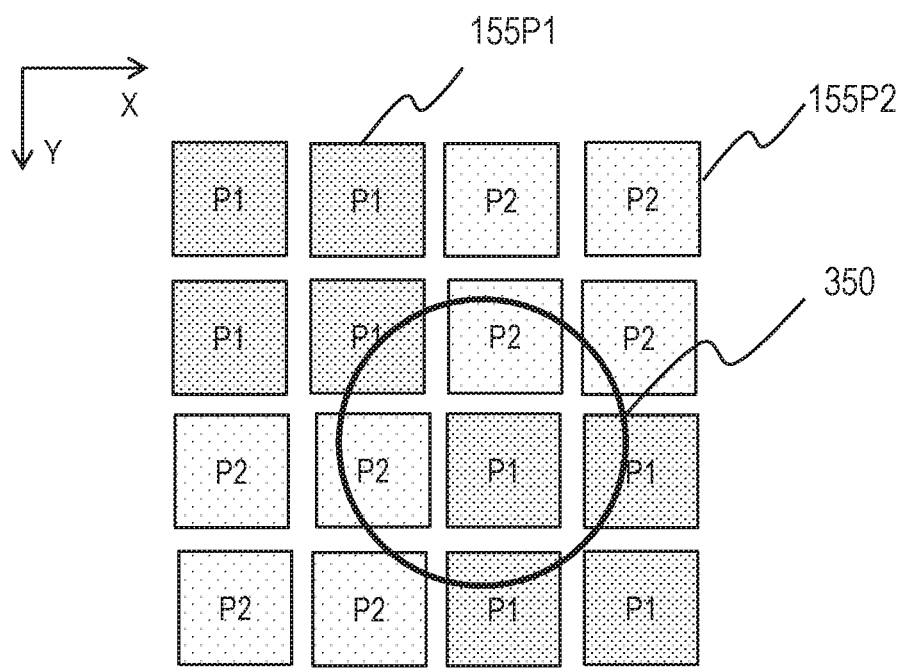
FIG. 13 illustrates an example of the pattern of signals in a region to present tactile stimuli.

Hereinafter, some examples of the pattern of the signals P1 and P2 (the electrodes supplied therewith) in a region to present tactile stimuli are described. FIG. 13 illustrates an example of the pattern of the signals P1 and P2 in a region to present tactile stimuli. Electrode units each consisting of four electrodes horizontally and vertically adjacent to one another are defined and the electrodes in a unit is supplied with the same signal P1 or P2.

The electrode units horizontally and vertically adjacent to an electrode unit composed of electrodes 155P1 to be supplied with the signal P1 are electrode units composed of electrodes 155P2 to be supplied with the signal P2. That is to say, a plurality of electrode units to be supplied with the signals P1 and P2 are laid out in a checkerboard pattern.

A region 350 touched by a touching object includes electrodes 155P1 to be supplied with the signal P1 and electrodes 155P2 to be supplied with the signal P2. That is to say, the touching object is capacitively coupled with electrodes 155P1 and electrodes 155P2 simultaneously and receives vibrating electrostatic forces from the electrodes 155P1 and the electrodes 155P2 simultaneously.

The controller 107 can change the pattern of the signals P1 and P2 to supply to the selected region depending on the contact area of the touching object. For example, the controller 107 supplies the signals P1 and P2 in the pattern in FIG. 3 in the case where the touching object has a small contact area and supplies the signals P1 and P2 in the pattern in FIG. 13 in the case where the touching object has a large contact area.

The number of electrodes constituting an electrode unit to be supplied with the same signal can be determined desirably depending on the contact area of the touching object. For example, an electrode unit can consist of 3×3 electrodes. In any configuration, a region to present tactile stimuli includes adjacent electrodes to be supplied with signals having different phases.

Figure 14:
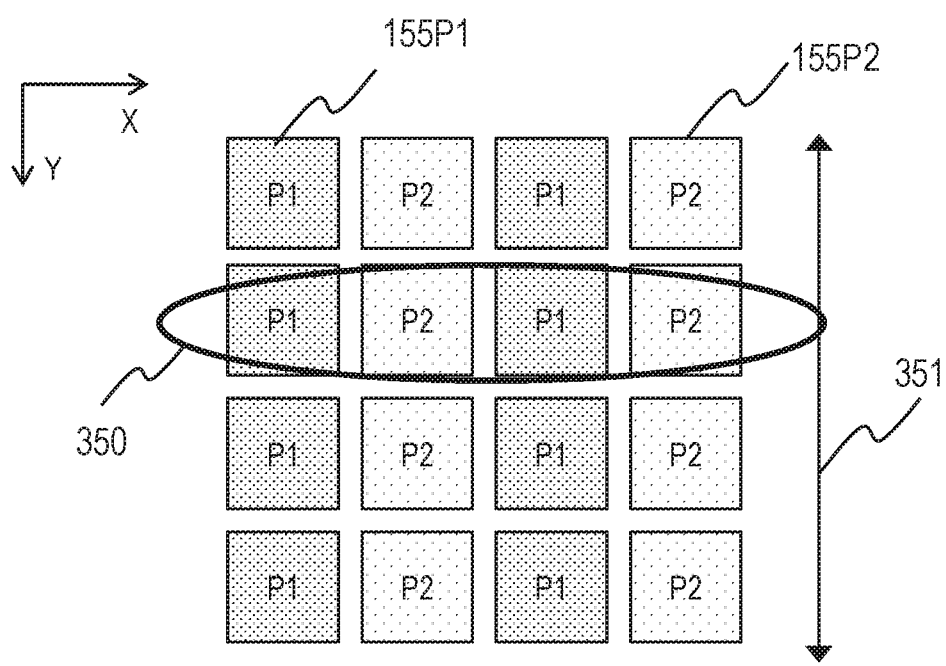
FIG. 14 illustrates another example of the pattern of signals in a region to present tactile stimuli.

FIG. 14 illustrates another example of the pattern of the signals P1 and P2 in a region to present tactile stimuli. The electrodes disposed in a column along the Y-axis are supplied with the same signal. The electrode columns adjacent along the X-axis to each other are supplied with different signals.

Specifically, electrode columns composed of electrodes 155P1 disposed in a line along the Y-axis and supplied with the signal P1 are disposed alternately along the X-axis with electrode columns composed of electrodes 155P2 disposed in a line along the Y-axis and supplied with the signal P2. Although electrodes adjacent along the Y-axis to each other are supplied with the same signal, electrodes adjacent along the X-axis to each other are supplied with the signal P1 and the signal P2 having different phases.

The contact region 350 of a touching object is longer along the X-axis than along the Y-axis and the direction of movement 351 of the touching object is along the Y-axis. The contact region 350 includes electrodes 155P1 and electrodes 155P2 at any position. That is to say, the touching object is capacitively coupled with electrodes 155P1 and electrodes 155P2 simultaneously and receives vibrating electrostatic forces from the electrodes 155P1 and the electrodes 155P2 simultaneously.

Figure 15:
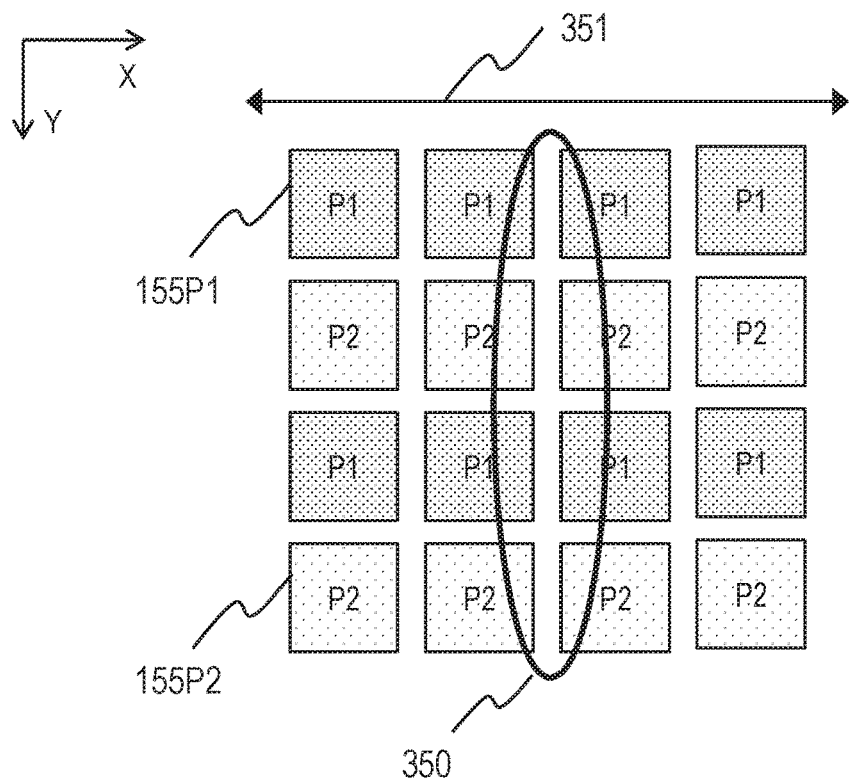
FIG. 15 illustrates still another example of the pattern of signals in a region to present tactile stimuli.

FIG. 15 illustrates still another example of the pattern of the signals P1 and P2 in a region to present tactile stimuli. The electrodes disposed in a row along the X-axis are supplied with the same signal. The electrode rows adjacent along the Y-axis to each other are supplied with different signals.

Specifically, electrode rows composed of electrodes 155P1 disposed in a line along the X-axis and supplied with the signal P1 are disposed alternately along the Y-axis with electrode rows composed of electrodes 155P2 disposed in a line along the X-axis and supplied with the signal P2. Although electrodes adjacent along the X-axis to each other are supplied with the same signal, electrodes adjacent along the Y-axis to each other are supplied with the signal P1 and the signal P2 having different phases.

The contact region 350 of a touching object is longer along the Y-axis than along the X-axis and the direction of movement 351 of the touching object is along the X-axis. The contact region 350 includes electrodes 155P1 and electrodes 155P2 at any position. That is to say, the touching object is capacitively coupled with electrodes 155P1 and electrodes 155P2 simultaneously and receives vibrating electrostatic forces from the electrodes 155P1 and the electrodes 155P2 simultaneously.

The stripe patterns in FIGS. 14 and 15 facilitate potential control for the electrodes 155. As noted from the foregoing description, an appropriate pattern can be selected depending on the direction of movement or the contact area of the touching object. Further, note that the controller 107 can supply the same signal to two or more consecutive columns in the example of FIG. 14 and two or more consecutive rows in the example of FIG. 15.

Figure 16:
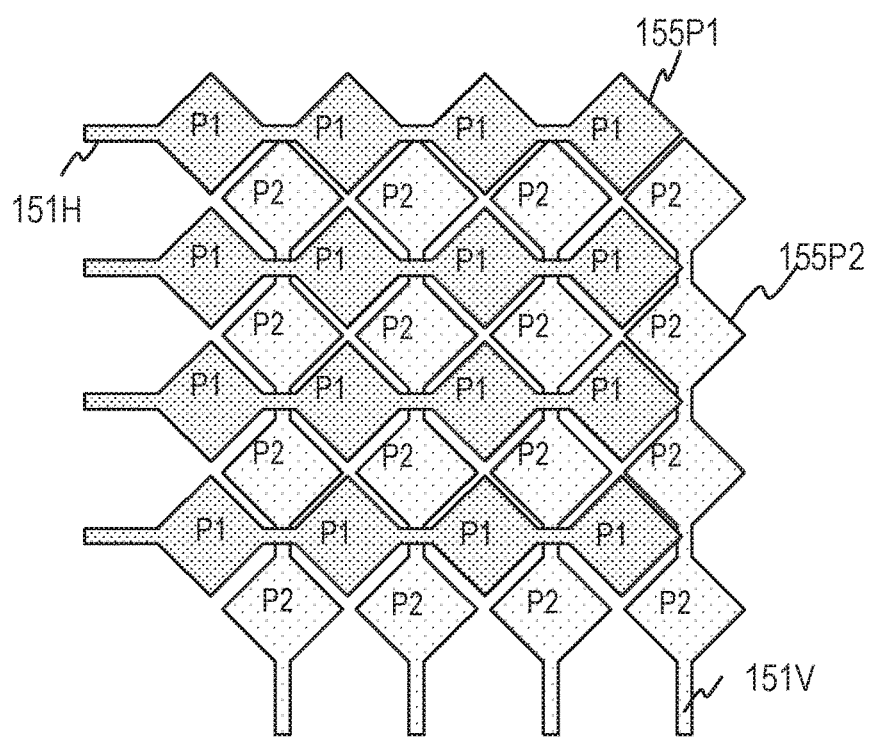
FIG. 16 illustrates still another example of the pattern of signals in a region to present tactile stimuli.

FIG. 16 illustrates still another example of the pattern of the signals P1 and P2 in a region to present tactile stimuli. The tactile presentation panel 105 has electrodes and lines laid out as illustrated in FIG. 2C. The lines 151H and the electrodes connected therewith are supplied with the signal P1. The lines 151V and the electrodes connected therewith are supplied with the signal P2. The electrodes 155P1 supplied with the signal P1 and the electrodes 155P2 supplied with the signal P2 are disposed in a checkerboard pattern.

Figure 17:
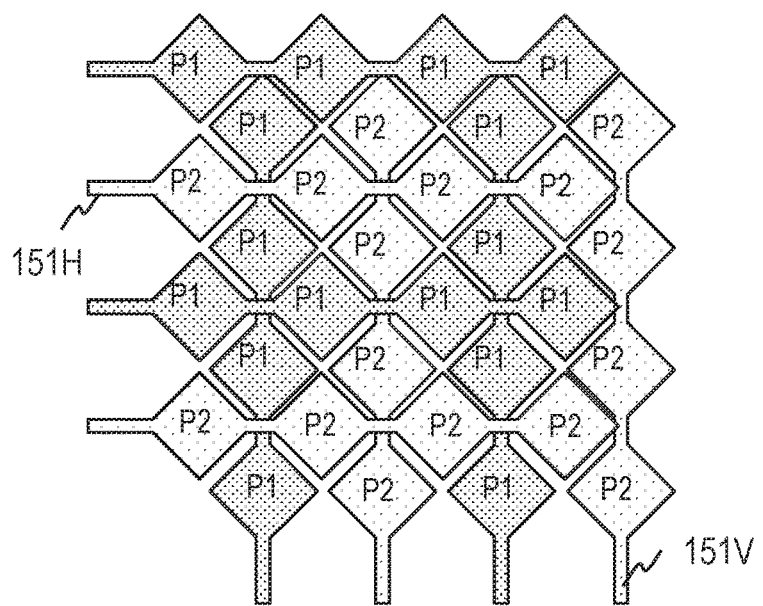
FIG. 17 illustrates still another example of the pattern of signals in a region to present tactile stimuli.

FIG. 17 illustrates still another example of the pattern of the signals P1 and P2 in a region to present tactile stimuli. The tactile presentation panel 105 has electrodes and lines laid out as illustrated in FIG. 2C. Every other line 151H and the electrodes connected therewith are supplied with the signal P1 and the remaining lines 151H and the electrodes connected therewith are supplied with the signal P2. Every other line 151V and the electrodes connected therewith are supplied with the signal P1 and the remaining lines 151V and the electrodes connected therewith are supplied with the signal P2.

Electrode units consisting of four adjacent electrodes 155P1 supplied with the signal P1 and electrode units consisting of four adjacent electrodes 155P2 supplied with the signal P2 are disposed in a checkerboard pattern. Compared to the pattern in FIG. 16, the pitch of the checkerboard is large.

Figure 18:
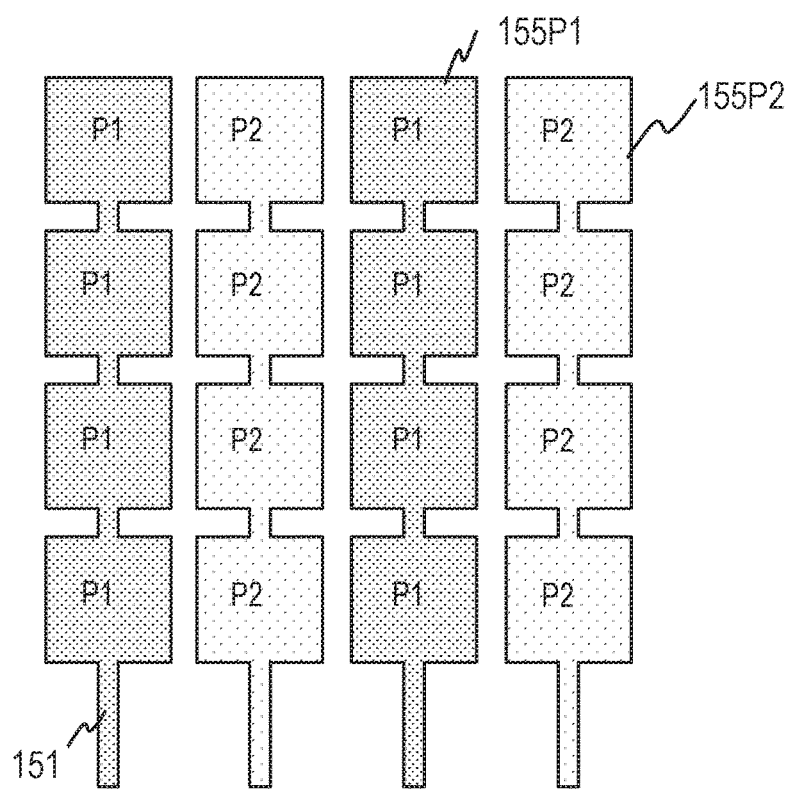
FIG. 18 illustrates still another example of the pattern of signals in a region to present tactile stimuli.

FIG. 18 illustrates still another example of the pattern of the signals P1 and P2 in a region to present tactile stimuli. The tactile presentation panel 105 has electrodes and lines laid out as illustrated in FIG. 2B. Every other line 151 and the electrodes connected therewith are supplied with the signal P1 and the remaining lines 151 and the electrodes connected therewith are supplied with the signal P2. The pattern of the signals P1 and P2 is the same as the pattern in FIG. 14.

As described above, the pattern of the signals can be changed as appropriate for the layout of the lines and the electrodes in accordance with the signals from the electrode driving circuit.

Electrode Driving Circuit

Hereinafter, examples of the configuration of the electrode driving circuit 106 are described. The electrode driving circuit 106 includes switches to connect/disconnect signal supply to a line. The signal supply includes reference signal supply and tactile signal supply. The tactile signal supply supplies a signal P1 or a signal P2.

Figure 19:
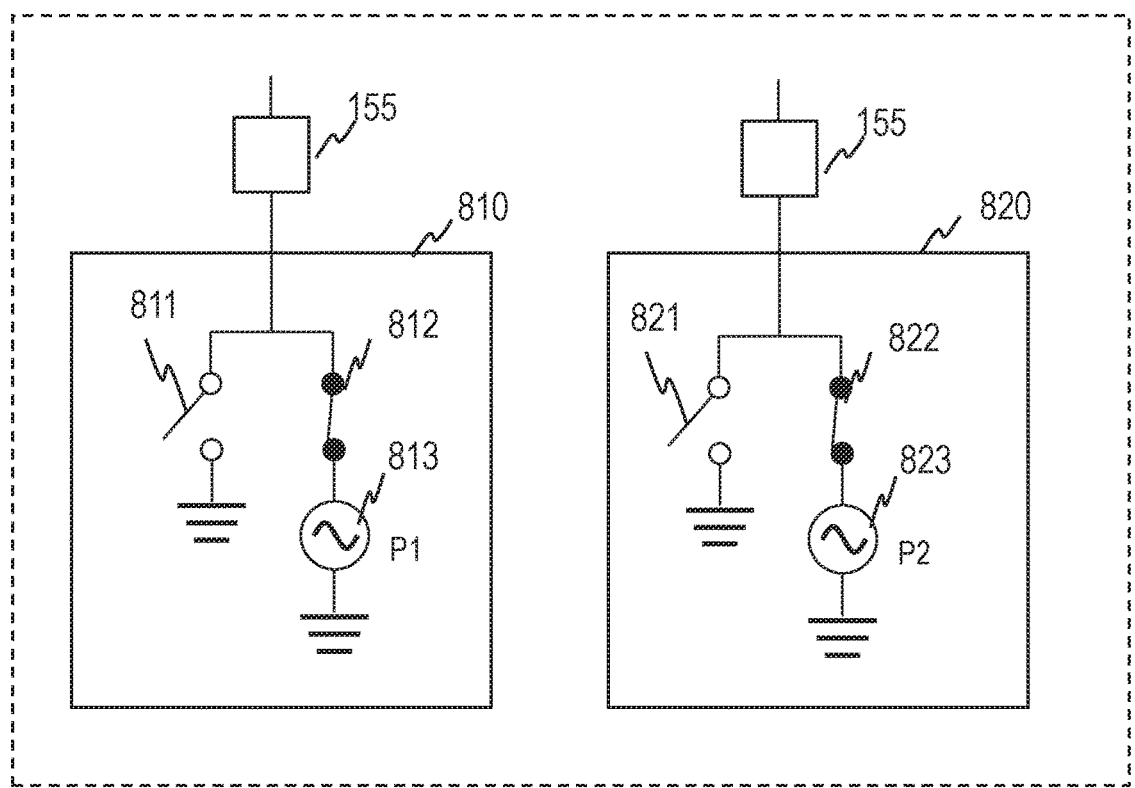
FIG. 19 illustrates a configuration example of an electrode driving circuit.

FIG. 19 illustrates a configuration example of the electrode driving circuit 106. The electrode driving circuit 106 includes circuits 810 for supplying the signal P1 and circuits 820 for supplying the signal P2. Each line is connected with a circuit 810 or a circuit 820. That is to say, each electrode is supplied only one of the signals P1 and P2 for tactile presentation. Hence, the electrode driving circuit 106 attains a simple configuration.

Each circuit 810 includes switches 811 and 812. The switch 811 connects the electrode 155 and the ground. The switch 812 connects the electrode 155 and the signal source 813 of the signal P1. The controller 107 controls the switches 811 and 812 to supply the electrode 155 with the ground potential (reference signal) or the signal P1 for tactile presentation.

Each circuit 820 includes switches 821 and 822. The switch 821 connects the electrode 155 and the ground. The switch 822 connects the electrode 155 and the signal source 823 of the signal P2. The controller 107 controls the switches 821 and 822 to supply the electrode 155 with the ground potential (reference signal) or the signal P2 for tactile presentation.

Figure 20:
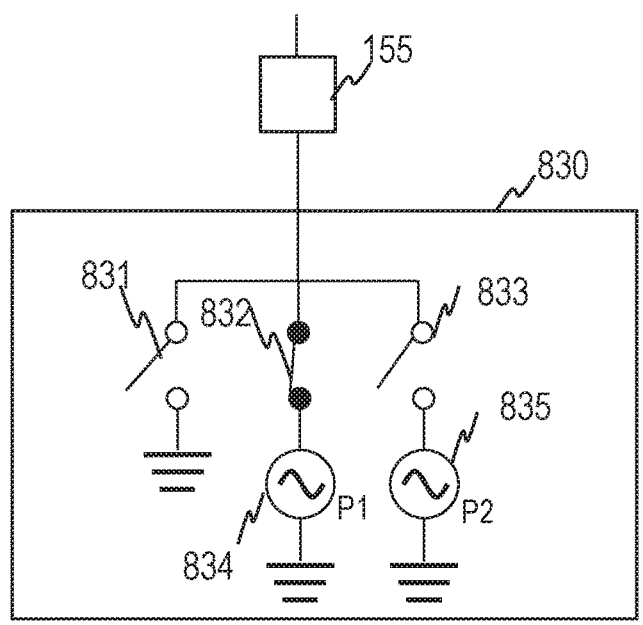
FIG. 20 illustrates another configuration example of an electrode driving circuit.

FIG. 20 illustrates another configuration example of the electrode driving circuit 106. The electrode driving circuit 106 includes circuits 830 for selecting and supplying the signal P1, the signal P2, or the reference signal. Each line is connected with a circuit 830.

The circuit 830 includes switches 831, 832, and 833. The switch 831 connects the electrode 155 and the ground. The switch 832 connects the electrode 155 and the signal source 834 of the signal P1. The switch 833 connects the electrode 155 and the signal source 835 of the signal P2. The controller 107 controls the switches 831, 832, and 833 to supply the electrode 155 with the ground potential (reference signal), the signal P1, or the signal P2. This configuration achieves various patterns of the signals P1 and P2.

Figure 21:
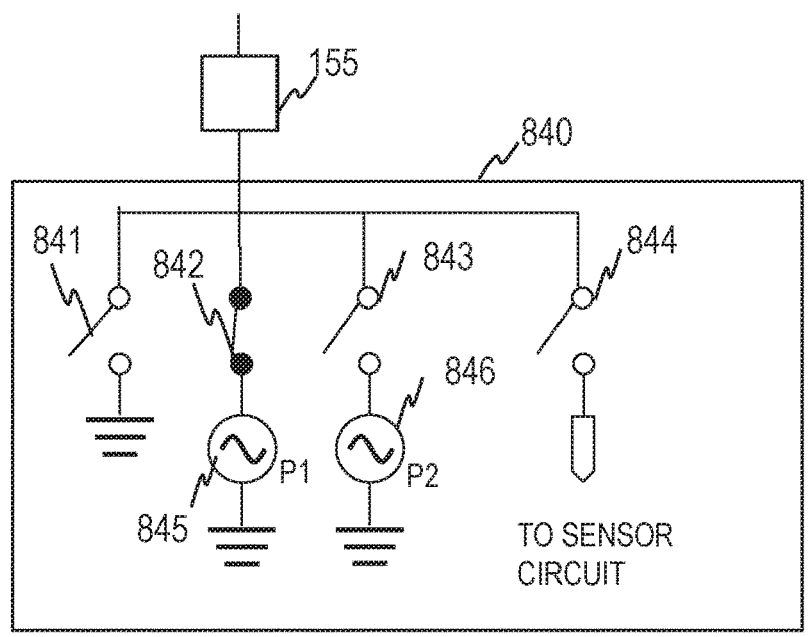
FIG. 21 illustrates still another configuration example of an electrode driving circuit.

FIG. 21 illustrates still another configuration example of the electrode driving circuit 106. The electrode driving circuit 106 includes circuits 840 for selecting and supplying the signal P1, the signal P2, or the reference signal and enabling a sensor function. Each line is connected with a circuit 840.

The circuit 840 includes switches 841, 842, 843, and 844. The switch 841 connects the electrode 155 and the ground. The switch 842 connects the electrode 155 and the signal source 845 of the signal P1. The switch 843 connects the electrode 155 and the signal source 846 of the signal P2. The switch 844 connects the electrode 155 and a sensor (not shown).

The controller 107 controls the switches 841, 842, 843, and 844 to supply the electrode 155 with the ground potential (reference signal), the signal P1, or the signal P2, or alternatively to supply the sensor with a signal from the electrode 155. This configuration incorporates a sensor function to the electrode as well as the tactile presentation function.

Figure 22:
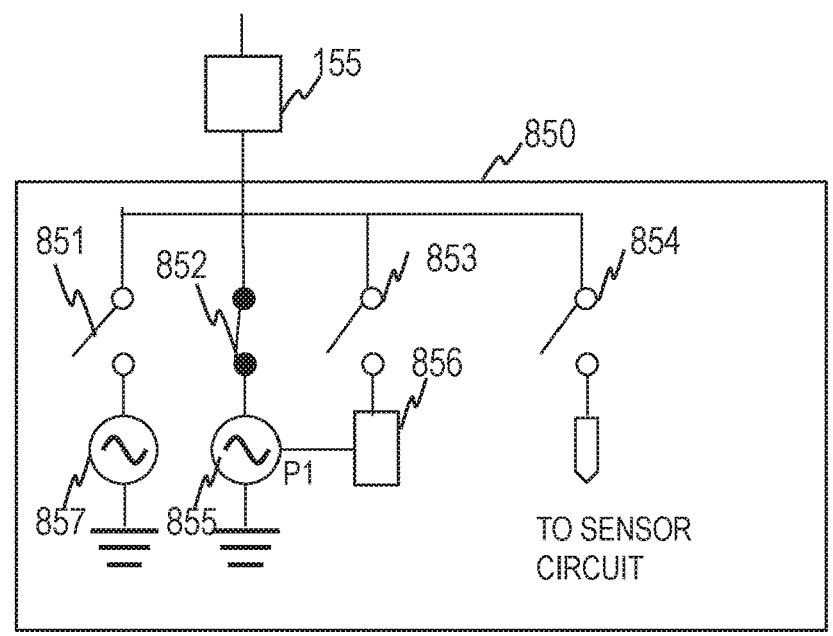
FIG. 22 illustrates still another configuration example of an electrode driving circuit.

FIG. 22 illustrates still another configuration example of the electrode driving circuit 106. The electrode driving circuit 106 includes circuits 850 for selecting and supplying the signal P1, the signal P2, or the reference signal and enabling a sensor function. Each line is connected with a circuit 850.

The circuit 850 includes switches 851, 852, 853, and 854. The switch 851 connects the electrode 155 and a reference signal 857. The switch 852 connects the electrode 155 and the signal source 855 of the signal P1. The switch 853 connects the electrode 155 and a phase shifter 856 connected with the signal source 855 of the signal P1. The switch 854 connects the electrode 155 and a sensor (not shown). The reference signal 857 can be a signal equivalent to the reference alternating signal of the sensor circuit. The phase shifter 856 generates a signal P2 different in phase from the signal P1. In the case where the phase difference between the signal P1 and the signal P2 is 180 degrees, the phase shifter 856 can be an inversion circuit.

Figure 23A:
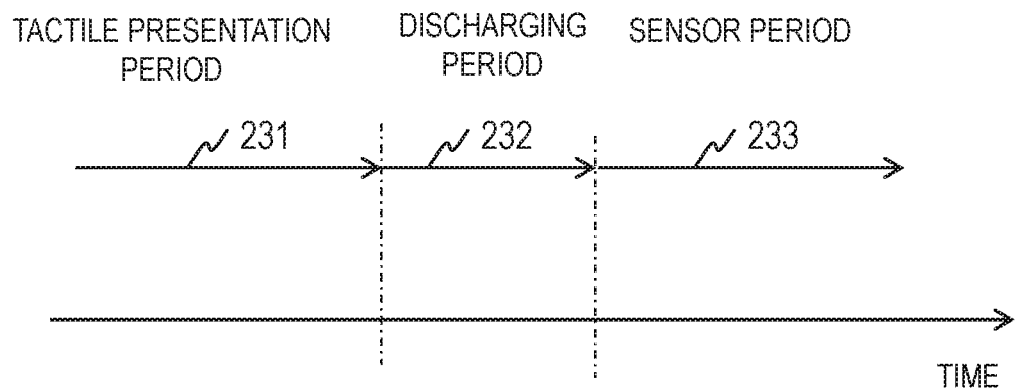
FIG. 23A illustrates periods in which the tactile presentation device is in different states.
Figure 23B:
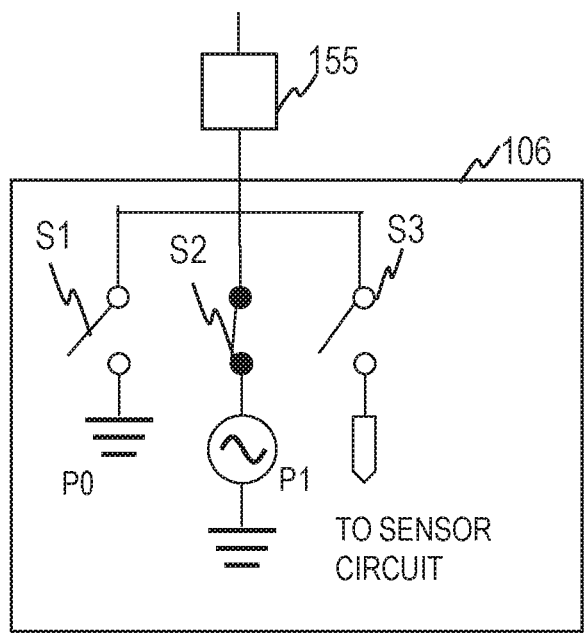
FIG. 23B illustrates the state of the electrode driving circuit in a tactile presentation period.
Figure 23C:
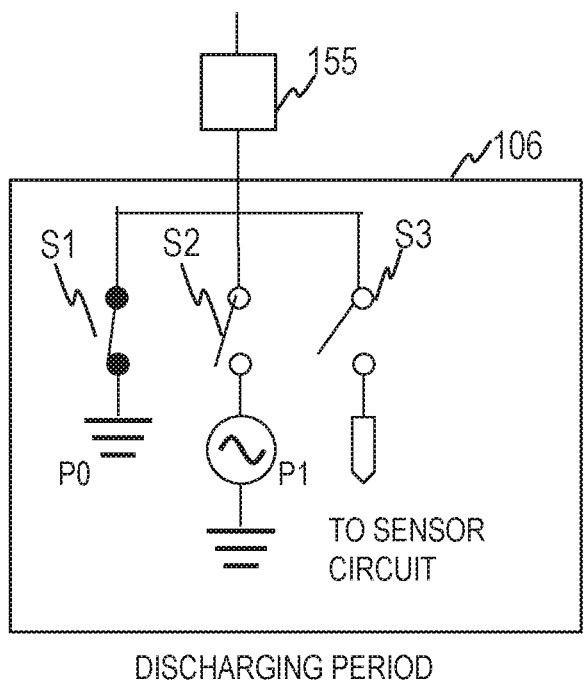
FIG. 23C illustrates the state of the electrode driving circuit in a discharging period.
Figure 23D:
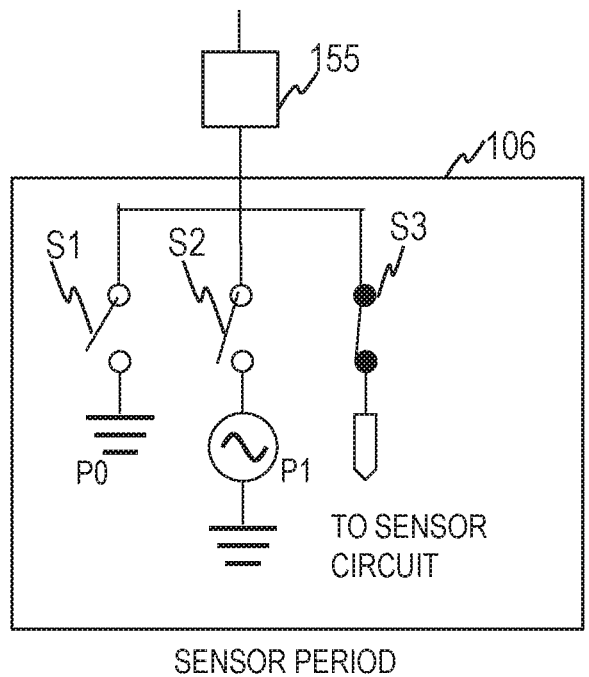
FIG. 23D illustrates the state of the electrode driving circuit in a sensor period.

With reference to FIGS. 23A to 23D, an example of providing a sensor function to the tactile presentation device is described. FIG. 23A illustrates periods in which the tactile presentation device 100 is in different states. FIGS. 23B to 23D each illustrate the state of the electrode driving circuit in the period of a different state. The tactile presentation device 100 connects/disconnects the switches connected with the electrode in turn to exhibit a tactile presentation period 231, a discharging period 232, and a sensor period 233.

In the tactile presentation period 231, the electrode 155 is connected with the signal P1 through the switch S2. In the discharging period 232, the electrode 155 is connected with the reference potential P0 through the switch S1. In the sensor period 233, the electrode 155 is connected with the sensor circuit through the switch S3. The reference potential P0 can be a reference potential supply, the ground, or an alternating current supply.

Since the voltage stored to the electrode 155 during the tactile presentation period 231 is discharged in the discharging period 232, the sensor circuit in the sensor period 233 is not affected by the voltage of the electrode to attain stable sensing.

Relationship Between Phase Difference and Strength of Tactile Stimuli

Hereinafter, the relationship between the phase difference and the strength of tactile stimuli is described. The following description is provided assuming that the touching object is a finger. As described above, the controller 107 inputs two sinusoidal signals having the same frequency but different phases to two electrodes adjacent to each other disposed on the panel. However, the body potential (potential of the finger) of the user varies depending on the condition of the user (inclusive of the environmental conditions) because the tactile presentation device 100 and the user are electrically independent systems.

For example, when the body is grounded, the potential of the finger is the ground potential. When the body is not grounded, the potential of the finger is the average of the potentials of the two signals P1 and P2 ((P1+P2)/2). Accordingly, the electrostatic force (strength of the tactile stimuli) generated between the finger and the electrodes of the tactile presentation device 100 varies with the condition of the user. Hence, it is desirable that the tactile presentation device 100 reduce the variation in electrostatic force (strength of the tactile stimuli) depending on the condition of the user.

The tactile presentation device 100 of this disclosure achieves small variation in electrostatic force (strength of the tactile stimuli) depending on the condition of the user by including the phase difference between the two sinusoidal signals within a specific range. Specific explanation is provided as follows.

Figure 24:
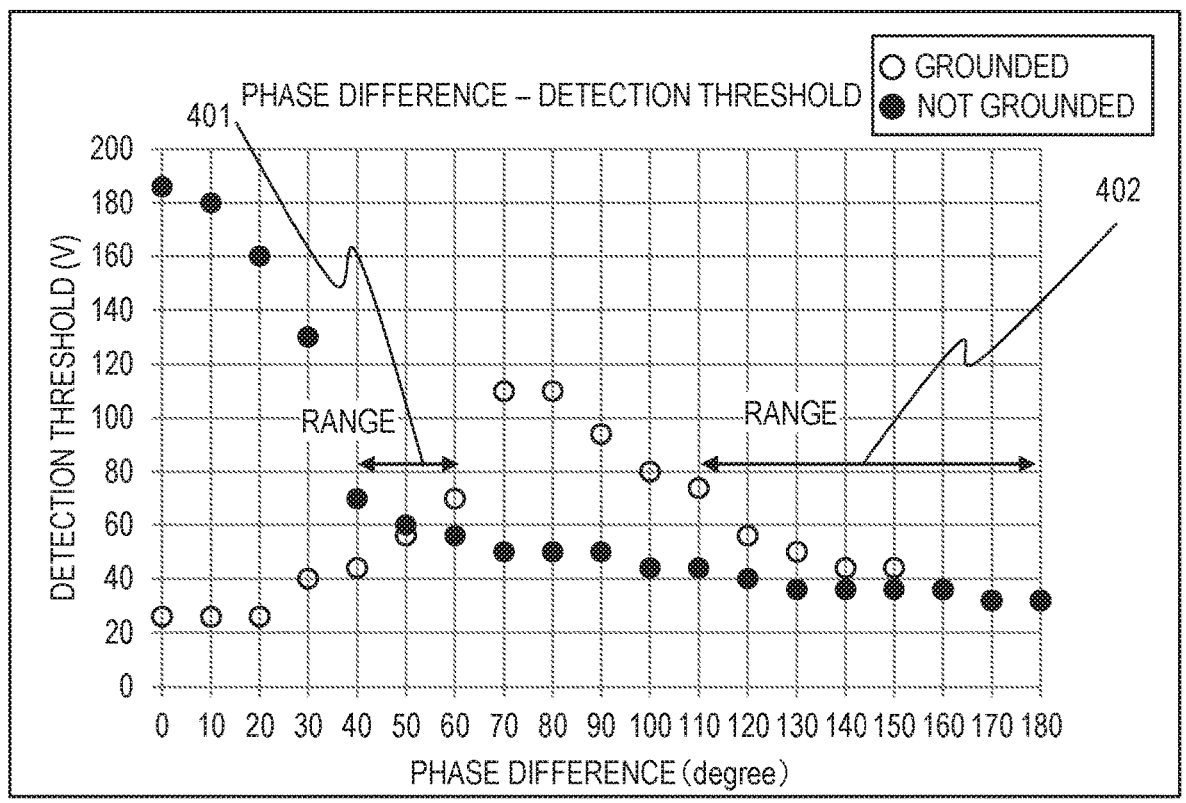
FIG. 24 provides subjective evaluation on the relationship between the phase difference in a sinusoidal signal pair and the minimum voltage amplitude (detection threshold) at which tactile stimuli are felt.

FIG. 24 provides subjective evaluation on the relationship between the phase difference in a sinusoidal signal pair and the minimum voltage amplitude (detection threshold) at which tactile stimuli are felt. In the graph of FIG. 24, the horizontal axis represents the phase difference (in degrees) in the sinusoidal signal pair and the vertical axis represents the voltage (detection threshold) at which a texture is felt. An open circle represents an evaluation when the body is grounded; a filled circle represents an evaluation when the body is not grounded. The detection thresholds were evaluated at every 10 degrees of phase difference.

The tactile presentation device used in this evaluation input two signals having different phases to the electrodes in a checkerboard pattern as described with reference to FIG. 3. The frequencies of the input signals were 150 Hz.

As understood from the graph of FIG. 24, the difference between the detection threshold when the body is grounded and the detection threshold when the body is not grounded varies significantly with the phase difference. In the graph of FIG. 24, the difference between the detection threshold when the body is grounded and the detection threshold when the body is not grounded is small in the range 401 where the phase difference is from 40 degrees to 60 degrees. Further, the difference between the detection threshold when the body is grounded and the detection threshold when the body is not grounded is also small in the range 402 where the phase difference is from 110 degrees to 180 degrees.

The detection threshold and the strength of the tactile stimuli have a relation such that the tactile stimuli are felt stronger when the detection threshold is lower and felt weaker when the detection threshold is higher, if the voltage amplitudes to present tactile stimuli are the same. FIG. 24 indicates that the difference between the detection threshold when the body is grounded and the detection threshold when the body is not grounded is small in the ranges 401 and 402. This means that the tactile presentation device presented substantially the same strength of tactile stimuli independently from whether the body is grounded or not in the ranges 401 and 402. FIG. 24 also indicates that the detection threshold in the range 401 is higher than the detection threshold in the range 402. The strength of the tactile stimuli from the tactile presentation device varied with the phase difference and the tactile stimuli were weaker in the range 401 than in the range 402.

If the tactile presentation device is electrically independent from the touching object, application to various devices is comparatively easy. However, the potential of the touching object varies with the environmental condition and the potentials of the electrodes near the touching object and accordingly, it is difficult to stably present certain strength of tactile stimuli (electrostatic force). In view of the evaluation in FIG. 24, stable presentation of certain strength of tactile stimuli is available by setting the phase difference in the sinusoidal signal pair within the range 401 or 402.

There is a difference in the strength of tactile stimuli between in the phase difference ranges 401 and 402. Specifically, the tactile stimuli is felt weaker in the phase difference range 401 than in the phase difference range 402. In the case of using sinusoidal signal pairs having different phase differences in separate regions or periods, the tactile presentation device 100 can select the phase difference for one sinusoidal signal pair from one phase difference range and the phase difference for the other sinusoidal signal pair from the other phase difference range. As a result, the strengths of the tactile stimuli can be distinguished clearly. The tactile presentation device 100 can select the phase differences for both of the sinusoidal signal pairs from one range of phase difference.

As set forth above, embodiments of this disclosure have been described; however, this disclosure is not limited to the foregoing embodiments. Those skilled in the art can easily modify, add, or convert each element in the foregoing embodiments within the scope of this disclosure. A part of the configuration of one embodiment can be replaced with a configuration of another embodiment or a configuration of an embodiment can be incorporated into a configuration of another embodiment.

What is claimed is:

1. A tactile presentation device comprising:
   a panel having a tactile presentation region including a plurality of electrodes; and
   a controller configured to control the panel,
   wherein the controller is configured to supply a first trigonometric series signal and a second trigonometric series signal simultaneously to a first region in the tactile presentation region,
   wherein the first trigonometric series signal and the second trigonometric series signal each comprise multiple frequency component terms, wherein the multiple frequency component terms of the first trigonometric series signal are the same as the multiple frequency component terms of the second trigonometric series signal,
   wherein the first trigonometric series signal and the second trigonometric series signal are supplied to different electrodes in the first region,
   wherein the first trigonometric series signal and the second trigonometric series signal have different phases, and
   wherein the controller is configured to supply a reference signal to a region adjacent to the first region, the reference signal having frequency components terms with coefficients smaller than coefficients of the frequency component terms of the first trigonometric series signal and the second trigonometric series signal.

2. The tactile presentation device according to claim 1, wherein the tactile presentation region includes a plurality of the first regions separated by periods of time, and wherein the controller is configured to supply the first trigonometric series signals and the second trigonometric series signals to the plurality of first regions.

3. The tactile presentation device according to claim 1, wherein a phase difference between the different phases is 180 degrees.

4. The tactile presentation device according to claim 1, wherein a potential of the reference signal is constant.

5. The tactile presentation device according to claim 1, wherein a circuit configured to supply the first trigonometric series signal and the second trigonometric series signal comprises a phase shifter.

6. The tactile presentation device according to claim 1, wherein the first trigonometric series signal is a first sinusoidal signal and the second trigonometric series signal is a second sinusoidal signal.

7. The tactile presentation device according to claim 6, wherein the tactile presentation region includes a plurality of first regions that are spatially separate during a same period of time, and
wherein the controller is configured to supply the first sinusoidal signal and the second sinusoidal signal simultaneously to the plurality of first regions.

8. The tactile presentation device according to claim 6, wherein a phase difference between the first sinusoidal signal and the second sinusoidal signal is 180 degrees.

9. The tactile presentation device according to claim 6, wherein a potential of the reference signal is constant.

10. The tactile presentation device according to claim 6, wherein a circuit configured to supply the first sinusoidal signal and the second sinusoidal signal comprises a phase shifter.

11. The tactile presentation device according to claim 6,
wherein the controller is configured to supply a third sinusoidal signal and a fourth sinusoidal signal simultaneously to a second region in the tactile presentation region,
wherein the third sinusoidal signal and the fourth sinusoidal signal are supplied to different electrodes in the second region,
wherein the third sinusoidal signal and the fourth sinusoidal signal have the same frequency and different phases, and
wherein a phase difference between the first sinusoidal signal and the second sinusoidal signal and a phase difference between the third sinusoidal signal and the fourth sinusoidal signal are different.

12. The tactile presentation device according to claim 11, wherein the first region and the second region are separate regions.

13. The tactile presentation device according to claim 11,
wherein at least a part of the second region is included in the first region, and
wherein the controller is configured to supply the third sinusoidal signal and the fourth sinusoidal signal to the second region during a period of time different from a period of time in which the first sinusoidal signal and the second sinusoidal signal are supplied to the first region.

14. The tactile presentation device according to claim 11, wherein the first sinusoidal signal, the second sinusoidal signal, the third sinusoidal signal, and the fourth sinusoidal signal have the same amplitude.

15. The tactile presentation device according to claim 11,
wherein the controller is configured to supply a fifth sinusoidal signal and a constant reference potential simultaneously to a third region in the tactile presentation region, and
wherein the fifth sinusoidal signal and the reference potential are supplied to different electrodes in the third region.

16. The tactile presentation device according to claim 11,
wherein a phase difference between the first sinusoidal signal and the second sinusoidal signal is in a first phase range from 40 degrees to 60 degrees,
wherein a phase difference between the third sinusoidal signal and the fourth sinusoidal signal is in a second phase range from 110 degrees to 180 degrees,
wherein the first range is separate from the second range.

17. The tactile presentation device according to claim 6, wherein a circuit configured to supply the first sinusoidal signal and the second sinusoidal signal comprises an inversion circuit.

18. The tactile presentation device according to claim 1, wherein a circuit configured to supply the first trigonometric series signal and the second trigonometric series signal comprises an inversion circuit.

* * * * *